United States Patent
Min et al.

(10) Patent No.: US 12,187,939 B2
(45) Date of Patent: *Jan. 7, 2025

(54) QUANTUM DOTS, PRODUCTION METHOD THEREOF, AND COMPOSITE AND ELECTRONIC DEVICE INCLUDING THE SAME

(71) Applicant: SAMSUNG ELECTRONICS CO., LTD., Suwon-si (KR)

(72) Inventors: Jihyun Min, Seoul (KR); Seon-Yeong Kim, Suwon-si (KR); Eun Joo Jang, Suwon-si (KR); Hyo Sook Jang, Suwon-si (KR); Soo Kyung Kwon, Suwon-si (KR); Yong Wook Kim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/130,453

(22) Filed: Apr. 4, 2023

(65) Prior Publication Data
US 2023/0250333 A1 Aug. 10, 2023

Related U.S. Application Data

(63) Continuation of application No. 16/519,188, filed on Jul. 23, 2019, now Pat. No. 11,634,628.

(30) Foreign Application Priority Data

Jul. 23, 2018 (KR) .................... 10-2018-0085495

(51) Int. Cl.
*C09K 11/70* (2006.01)
*C09K 11/62* (2006.01)
(Continued)

(52) U.S. Cl.
CPC .............. *C09K 11/70* (2013.01); *C09K 11/62* (2013.01); *C09K 11/883* (2013.01); *H01L 29/122* (2013.01); *H10K 59/38* (2023.02)

(58) Field of Classification Search
CPC ........ C09K 11/70; C09K 11/62; C09K 11/883
See application file for complete search history.

(56) References Cited

U.S. PATENT DOCUMENTS 7,253,452 B2 8/2007 Steckel et al.
7,791,157 B2 9/2010 Cho et al.
(Continued)

FOREIGN PATENT DOCUMENTS

CN 101208808 A 6/2008
CN 104810159 B 4/2017
(Continued)

OTHER PUBLICATIONS

Chinese Office Action for Chinese Patent Application No. 1201910665612.5 dated Jun. 16, 2023.
(Continued)

*Primary Examiner* — Matthew E. Hoban
(74) *Attorney, Agent, or Firm* — CANTOR COLBURN LLP

(57) ABSTRACT

A quantum dot including a semiconductor nanocrystal core and a semiconductor nanocrystal shell disposed on the core and does not include cadmium, wherein the core includes a Group III-V compound, the quantum dot has a maximum photoluminescence peak in a green light wavelength region, a full width at half maximum (FWHM) of the maximum photoluminescence peak is less than about 50 nanometers (nm), and a difference between a wavelength of the maximum photoluminescence peak and a first absorption peak wavelength of the quantum dot is less than or equal to about 25 nanometers, and a production method thereof.

23 Claims, 10 Drawing Sheets

(51) Int. Cl.
   *C09K 11/88* (2006.01)
   *H01L 29/12* (2006.01)
   *H10K 59/38* (2023.01)

(56) References Cited

U.S. PATENT DOCUMENTS

| | | | |
|---|---|---|---|
| 8,072,039 | B2 | 12/2011 | Cho et al. |
| 8,080,437 | B2 | 12/2011 | Steckel et al. |
| 8,541,810 | B2 | 9/2013 | Steckel et al. |
| 9,169,435 | B2 | 10/2015 | Guo et al. |
| 9,631,141 | B2 | 4/2017 | Guo et al. |
| 9,685,583 | B2 | 6/2017 | Guo et al. |
| 9,884,993 | B2 | 2/2018 | Guo et al. |
| 10,017,692 | B2 | 7/2018 | Nam et al. |
| 10,074,770 | B2 | 9/2018 | Park et al. |
| 10,510,922 | B2 | 12/2019 | Peng et al. |
| 10,707,371 | B2 | 7/2020 | Guo et al. |
| 11,634,628 | B2 * | 4/2023 | Min ............... H01L 29/122 |
| | | | 252/301.6 P |
| 2005/0258418 | A1 | 11/2005 | Steckel et al. |
| 2011/0229998 | A1 | 9/2011 | Steckel et al. |
| 2012/0061644 | A1 | 3/2012 | Steckel et al. |
| 2014/0001405 | A1 | 1/2014 | Guo et al. |
| 2015/0232756 | A1 | 8/2015 | Guo et al. |
| 2015/0236195 | A1 | 8/2015 | Guo et al. |
| 2016/0096992 | A1 | 4/2016 | Guo et al. |
| 2017/0179338 | A1 | 6/2017 | Park et al. |
| 2017/0250322 | A1 * | 8/2017 | Wang ............... C09K 11/883 |
| 2017/0306227 | A1 * | 10/2017 | Ippen ............... C09K 11/70 |
| 2018/0119007 | A1 | 5/2018 | Ippen et al. |
| 2018/0155623 | A1 | 6/2018 | Guo et al. |
| 2018/0301592 | A1 * | 10/2018 | Peng ............... H01L 33/0062 |
| 2019/0006556 | A1 | 1/2019 | Park et al. |

FOREIGN PATENT DOCUMENTS

| | | |
|---|---|---|
| CN | 110506096 A | 11/2019 |
| KR | 0682928 B1 | 2/2007 |
| KR | 20150034755 A | 4/2015 |
| KR | 20170018210 A | 2/2017 |
| KR | 1020170074585 A | 6/2017 |
| WO | 2017201386 A1 | 11/2017 |
| WO | 2018188604 A1 | 10/2018 |

OTHER PUBLICATIONS

Notice of Allowance dated Aug. 25, 2023 of the corresponding Korean Patent Application No. 10-2019-0089161.

Dylan C. Gary et al., "Investigation of Indium Phosphide Quantum Dot Nucleation and Growth Utilizing Triarylsilylphosphine Precursors," Chemistry of Materials, Jan. 24, 2014, pp. 1734-1744, vol. 26, No. 4.

Jaehoon Lim et al., "Highly Efficient Cadmium-Free Quantum Dot Light-Emitting Diodes Enabled by the Direct Formation of Excitons within InP@ZnSeS Quantum Dots," ACS Nano, Sep. 24, 2013, pp. 9019-9026, vol. 7, No. 10.

M. Kuno et al., "Band-edge exciton in quantum dots of semiconductors with a degenerate valence band: Dark and bright exciton states," Physical Review B, Aug. 15, 1996, pp. 4843-4856, vol. 54, No. 7.

Mickael D. Tessier et al., "Aminophosphines: A Double Role in the Synthesis of Colloidal Indium Phosphide Quantum Dots," Journal of the American Chemical Society, Apr. 25, 2016, pp. 5923-5929, vol. 138, No. 18.

Mickael D. Tessier et al., "Economic and Size-Tunable Synthesis of InP/ZnE (E = S, Se) Colloidal Quantum Dots," Chemistry of Materials, Jun. 11, 2015, pp. 4893-4898, vol. 27, No. 13.

Parthiban Ramasamy et al., "Tunable, Bright, and Narrow-Band Luminescence from Colloidal Indium Phosphide Quantum Dots," Chemistry of Materials, Aug. 4, 2017, pp. 6893-6899, vol. 29.

Ramasamy, Two-Step Seed Mediated Synthetic Approach to Colloidal Indium Phosphide quantum dots with high-purity photo- and electroluminescence. Chem. Mater. 2018, 30, 3643-3647(Year:2018).

Ron Tenne et al., "From dilute isovalent substitution to alloying in CdSeTe nanoplatelets," Physical Chemistry Chemical Physics, May 5, 2016, pp. 15295-15303, vol. 18.

Yemliha Altintas et al., "Efficient Forster Resonance Energy Transfer Donors of In(Zn)P/ZnS Quantum Dots," The Journal of Physical chemistry C, Jan. 3, 2017, pp. 3034-3043, vol. 121, Issue 5.

* cited by examiner

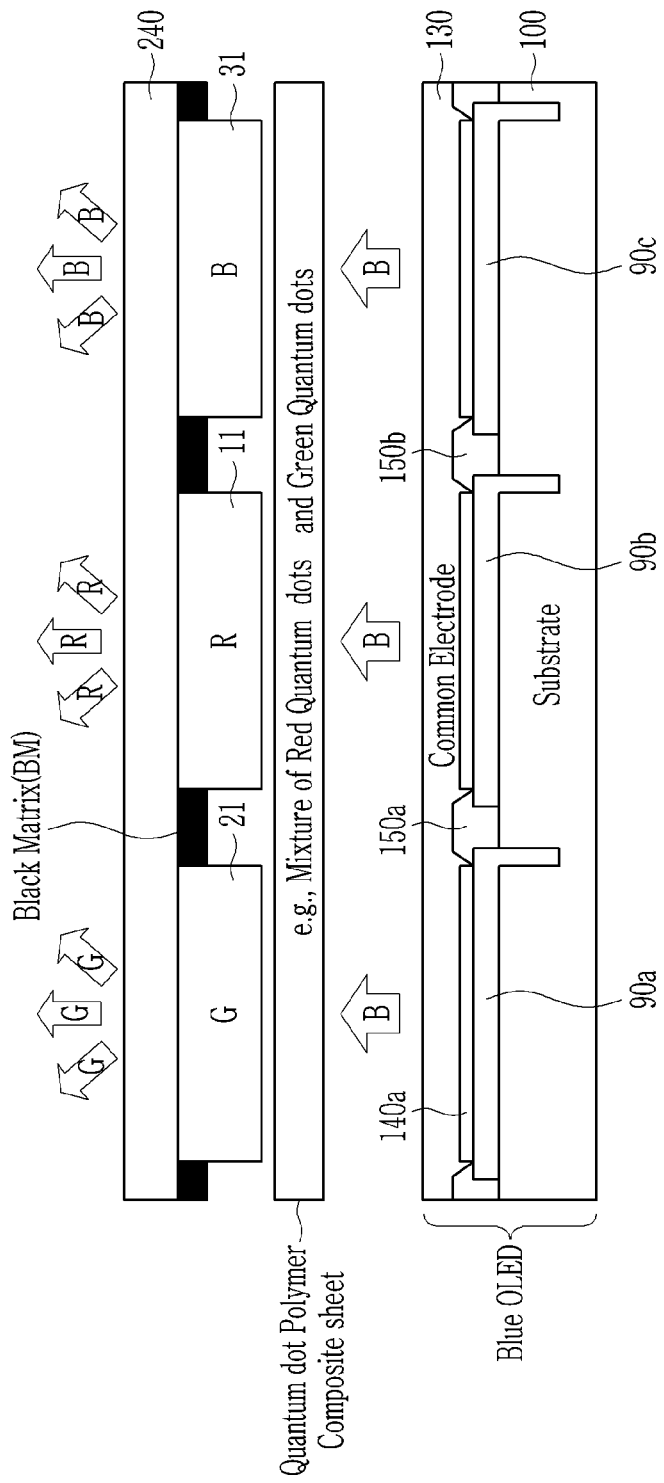

Pattern Preparation by using a photoresist

Repeating the Patterning Process three times

QUANTUM DOTS, PRODUCTION METHOD THEREOF, AND COMPOSITE AND ELECTRONIC DEVICE INCLUDING THE SAME

CROSS-REFERENCE TO RELATED APPLICATIONS

This application is a continuation application of application Ser. No. 16/519,188, filed Jul. 23, 2019, which claims priority to and the benefit of Korean Patent Application No. 10-2018-0085495 filed in the Korean Intellectual Property Office on Jul. 23, 2018, and all the benefits accruing therefrom under 35 U.S.C. § 119, the entire contents of which in their entirety are herein incorporated by reference.

BACKGROUND

1. Field

Quantum dots, production methods thereof, and composites and electronic devices including the same are disclosed.

2. Description of the Related Art

Quantum dots (i.e., nano-sized semiconductor nanocrystals) may have different energy bandgaps by changing sizes and compositions of nanocrystals, and thus may emit light of various photoluminescence wavelengths. Quantum dots may exhibit electroluminescence properties. Photoluminescence properties of quantum dots may be applied in various fields. Developments for quantum dots capable of exhibiting improved electroluminescence properties and not including a heavy metal (e.g., cadmium, lead, etc.) are desirable.

SUMMARY

An embodiment provides quantum dots or clusters of the quantum dots capable of exhibiting improved electroluminescence properties.

An embodiment provides a method of producing the quantum dot.

An embodiment provides a composition including the quantum dot.

An embodiment provides a quantum dot-polymer composite including the quantum dot.

An embodiment provides an electronic device including the quantum dot.

In an embodiment, a quantum dot includes a semiconductor nanocrystal core and a semiconductor nanocrystal shell disposed on the core and does not include cadmium. In the quantum dot, the core includes a Group III-V compound including a group III metal and a group V element (e.g., a compound including indium and phosphorous), the quantum dot has a maximum photoluminescence peak in a green light wavelength region, a full width at half maximum (FWHM) of the maximum photoluminescence peak is less than about 50 nanometers (nm), and a difference (hereinafter, also referred to as a Stokes shift) between a wavelength of the maximum photoluminescence peak and a first absorption peak wavelength of the quantum dot is less than or equal to about 25 nm.

The green light wavelength region may be greater than or equal to about 500 nm and less than or equal to about 560 nm.

The full width at half maximum (FWHM) of the maximum photoluminescence peak may be less than or equal to about 35 nm.

The FWHM of the maximum photoluminescence peak may be less than or equal to about 34 nm.

The FWHM of the maximum photoluminescence peak may be less than or equal to about 33 nm.

The quantum dot may include indium and zinc.

The quantum dot may have a size of greater than or equal to about 1.5 nm.

The quantum dot may have quantum efficiency (quantum yield) of greater than or equal to about 80%.

The quantum dot may further include an additive including a Group IV element, As, Sb, Bi, Te, or a combination thereof (e.g., in the core). The Group IV element may include tin (Sn).

In the quantum dot, a molar amount of the additive with respect to 1 mole of the Group III metal (e.g., indium) may be less than 0.1 moles.

In the quantum dot, a molar amount of the additive with respect to 1 mole of the Group III metal may be less than or equal to about 0.08 moles.

In the quantum dot, a molar amount of the additive with respect to 1 mole of the Group III metal may be less than or equal to about 0.05 moles.

In the quantum dot, a molar amount of the additive with respect to 1 mole of the Group III metal may be less than or equal to about 0.03 moles.

In the quantum dot, a molar amount of the additive with respect to 1 mole of the Group III metal may be less than or equal to about 0.025 moles.

In the quantum dot, a molar amount of the additive with respect to 1 mole of the Group III metal may be less than or equal to about 0.02 moles.

In the quantum dot, a molar amount of the additive with respect to 1 mole of the Group III metal may be less than or equal to about 0.01.

In the quantum dot, a molar amount of the additive with respect to 1 mole of the Group III metal may be less than or equal to about 0.005.

In the quantum dot, a molar amount of the additive with respect to 1 mole of the Group III metal may be greater than or equal to about 0.0001.

In the quantum dot, a molar amount of the additive with respect to 1 mole of the Group III metal may be greater than or equal to about 0.001.

The shell may include a first semiconductor nanocrystal shell including zinc and selenium and a second semiconductor nanocrystal shell disposed on the first semiconductor nanocrystal shell, and the second semiconductor nanocrystal shell may include zinc and sulfur.

The first semiconductor nanocrystal shell may be disposed directly on a surface of the semiconductor nanocrystal core and the first semiconductor nanocrystal shell may not include sulfur.

The first semiconductor nanocrystal shell may have a thickness of greater than or equal to about 1 monolayer, greater than or equal to about 2 monolayers, or greater than or equal to 3 monolayers. The first semiconductor nanocrystal shell may have a thickness of less than or equal to about 10 monolayers.

In an embodiment, the first semiconductor nanocrystal shell may have a thickness of less than or equal to about 1 monolayer, or may have a thickness of less than or equal to about 0.5 monolayer.

A thickness of the first semiconductor nanocrystal shell may be less than or equal to about 1 nm, for example, less than or equal to about 0.9 nm, less than or equal to about 0.8 nm, less than or equal to about 0.7 nm, or less than or equal to about 0.65 nm.

The second semiconductor nanocrystal shell may be an outermost layer of the quantum dot.

The second semiconductor nanocrystal shell may be directly disposed on the first semiconductor nanocrystal shell.

The second semiconductor nanocrystal shell may include ZnSeS, ZnS, or a combination thereof.

The second semiconductor nanocrystal shell may have a changed composition in a radial direction.

The second semiconductor nanocrystal shell may have a concentration gradient of sulfur that is increased toward the surface of the quantum dot.

A thickness of the second semiconductor nanocrystal shell may be less than or equal to about 1 nm, for example, less than or equal to about 0.9 nm, less than or equal to about 0.8 nm, less than or equal to about 0.7 nm, less than or equal to about 0.65 nm.

The core may include indium, phosphorus, and optionally zinc and the shell may include zinc, sulfur, and selenium.

In the quantum dot, a mole ratio of sulfur, and selenium relative to indium may be greater than or equal to about 20:1 and less than or equal to about 36:1. In the quantum dot, a mole ratio of phosphorus relative to indium may be greater than or equal to about 0.6:1 and less than or equal to about 0.9:1. In the quantum dot, a mole ratio of zinc relative to indium may be greater than or equal to about 25:1 and less than or equal to about 40:1.

The difference between the wavelength of the maximum photoluminescence peak and the first absorption peak wavelength of the quantum dot may be less than or equal to about 22 nm.

The difference between the wavelength of the maximum photoluminescence peak and the first absorption peak wavelength of the quantum dot may be less than or equal to about 20 nm.

In a photoluminescent spectrum of the quantum dot, a ratio of a tail area with respect to a total area of a photoluminescent spectrum curve may be less than or equal to about 10%.

In a photoluminescent spectrum of the quantum dot, a ratio of an intensity at a tail initiation wavelength (e.g., about 580 nm) with respect to an intensity at a maximum photoluminescent peak wavelength may be less than or equal to about 0.12:1.

In a photoluminescent spectrum of the quantum dot, a ratio of an intensity at a tail initiation wavelength with respect to an intensity at a maximum photoluminescent peak wavelength may be less than or equal to about 0.11:1.

In a photoluminescent spectrum of the quantum dot, a ratio of an intensity at a tail initiation wavelength with respect to an intensity at a maximum photoluminescent peak wavelength may be less than or equal to about 0.1:1.

In a photoluminescent spectrum of the quantum dot, a ratio of an intensity at a tail initiation wavelength with respect to an intensity at a maximum photoluminescent peak wavelength may be less than or equal to about 0.095:1.

In a photoluminescent spectrum of the quantum dot, a ratio of an intensity at a tail initiation wavelength with respect to an intensity at a maximum photoluminescent peak wavelength may be less than or equal to about 0.09:1.

In an embodiment, a method of producing the aforementioned quantum dot includes, obtaining (e.g., preparing) a semiconductor nanocrystal core comprising a Group III-V compound including a group III metal and a group V element;

preparing a first solution including a shell metal precursor and an organic ligand;

adding the semiconductor nanocrystal core to the first solution at a first temperature; and heating the first solution including the semiconductor nanocrystal core to a second temperature and adding a shell non-metal precursor to the first solution to form the semiconductor nanocrystal shell on a surface of the semiconductor nanocrystal core and produce the quantum dot, wherein the first temperature is less than or equal to about 150° C. and the second temperature is greater than or equal to about 250° C., for example, greater than or equal to about 260° C., greater than or equal to about 270° C., greater than or equal to about 280° C., or greater than or equal to about 290° C. and less than or equal to about 350° C.

The semiconductor nanocrystal core may further include an additive including a Group IV element, As, Sb, Bi, Te, or a combination thereof.

The Group IV element may include tin.

The first temperature may be less than or equal to about 120° C.

The second temperature may be greater than or equal to about 300° C. and less than or equal to about 330° C.

Forming of the semiconductor nanocrystal shell may include adding the shell non-metal precursor and optionally a shell metal precursor to the first solution at least twice.

During the preparation of the semiconductor nanocrystal core and/or the formation of the shell, a group V element precursor (e.g., a phosphorous precursor) may be added at least two times (e.g., injected in a split manner).

The method may further include adding an additional precursor to the first solution during formation of the semiconductor nanocrystal shell, the preparation of the semiconductor nanocrystal core, or a combination thereof.

The additional precursor may include ammonium fluoride, a precursor including the aforementioned additive, or a combination thereof.

The method may further include adding ammonium fluoride, a Group IV element, or a combination thereof to the first solution during formation of the semiconductor nanocrystal shell.

An amount of the additional precursor may be greater than or equal to about 0.001 moles and less than or equal to about 0.1 moles per one mole of the Group III metal.

In an embodiment, a quantum dot-polymer composite includes a polymer matrix; and a plurality of quantum dots dispersed in the polymer matrix, wherein the plurality of quantum dots may include the aforementioned quantum dots (or a population thereof).

The polymer matrix may include a cross-linked polymer, a binder polymer having a carboxylic acid group, or a combination thereof.

The cross-linked polymer may include a polymerization product of a photopolymerizable monomer including a carbon-carbon double bond, a polymerization product of the photopolymerizable monomer and a multiple thiol compound having at least two thiol groups at the terminal end, or a combination thereof.

The quantum dot-polymer composite may further include a metal oxide fine particle in the polymer matrix.

The quantum dot-polymer composite may be in a form of a film having a thickness of greater than or equal to about 1 micrometer (um) and less than or equal to about 200 um.

The quantum dot polymer composite may be configured to emit light having a full width at half maximum of a photoluminescent peak that is less than or equal to about 38 nm.

The full width at half maximum of a photoluminescent peak may be less than or equal to about 37 nm.

The full width at half maximum of a photoluminescent peak may be less than or equal to about 36 nm.

The full width at half maximum of a photoluminescent peak may be less than or equal to about 35 nm.

The full width at half maximum of a photoluminescent peak may be less than or equal to about 34 nm.

The quantum dot polymer composite may be configured to emit light having Cy of greater than or equal to about 0.23 and less than or equal to about 0.24 in a color coordination.

The quantum dot polymer composite may be configured to emit light having Cx of greater than or equal to about 0.18 and less than or equal to about 0.19 in a color coordination.

In an embodiment, a display device includes a light source and a photoluminescence element, wherein the photoluminescence element includes the aforementioned quantum dot or the aforementioned quantum dot-polymer composite and the light source is configured to provide the photoluminescence element with incident light.

The incident light may have a photoluminescence peak wavelength of about 440 nm to about 460 nm.

The photoluminescence element may include a sheet of the quantum dot polymer composite.

The display device may further include a liquid crystal panel, and
the sheet of the quantum dot polymer composite may be disposed between the light source and the liquid crystal panel.

The photoluminescence element is a stack structure including a substrate and a light emission layer disposed on the substrate, wherein the light emission layer includes a pattern of the quantum dot polymer composite and the pattern includes at least one repeating section to emit light at a predetermined wavelength.

The display device may be configured to have color reproducibility of greater than or equal to about 80% under a standard of BT2020.

The display device may be configured to have color reproducibility of greater than or equal to about 85% under a standard of BT2020. The display device may be configured to have color reproducibility of greater than or equal to about 88% under a standard of BT2020. The display device may be configured to have color reproducibility of greater than or equal to about 90% under a standard of BT2020.

The display device may not include a color filter (e.g., blocking red light and/or green light).

The pattern may include a first section to emit a first light and a second section to emit a second light having a different center wavelength from the first light.

The light source may include a plurality of light emitting units corresponding to each of the first section and the second section, wherein a first electrode and a second electrode facing the light emitting units and an electroluminescence layer disposed between the first electrode and the second electrode.

The display device may further include a lower substrate, a polarizer disposed under the lower substrate, and a liquid crystal layer disposed between the stack structure and the lower substrate, wherein the stack structure is disposed so that the light emission layer faces the liquid crystal layer.

The display device may further include a polarizer between the liquid crystal layer and the light emission layer.

The light source may include a light emitting diode (LED) and optionally a light guide panel.

The quantum dot according to an embodiment may emit green light having improved electroluminescence properties. The quantum dot according to an embodiment may be used in various display devices and biological labelling (e.g., bio sensor, bio imaging, etc.), a photo detector, a solar cell, a hybrid composite, and the like. A display device including the quantum dot according to an embodiment may exhibit improved display quality (e.g., increased color reproducibility under the next generation color standard BT2020 reference).

BRIEF DESCRIPTION OF THE DRAWINGS

FIG. 1B is a cross-sectional view of a display device according to an embodiment.

DETAILED DESCRIPTION

Figure 1A:
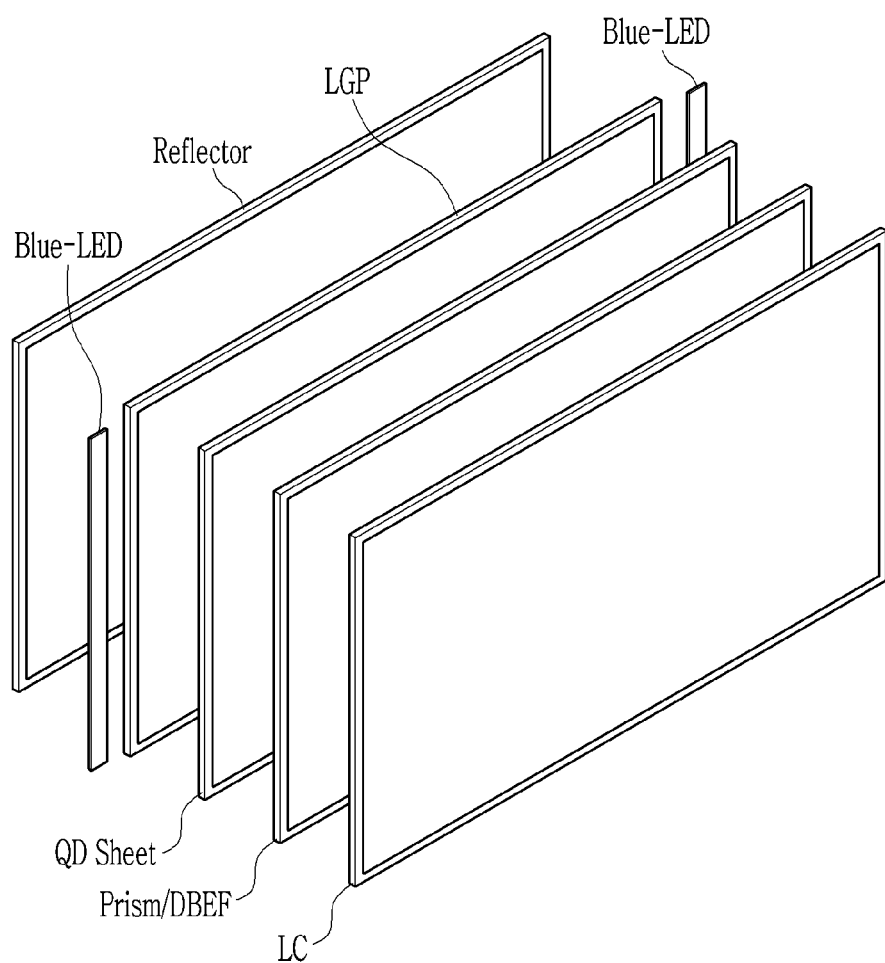
FIG. 1A is an exploded view of a display device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by a person skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound or a group by a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C40 heteroaryl group, a C3 to C30 alkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a thiocyanate group (—SCN), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "hetero" refers to inclusion of one to three heteroatoms, wherein the heteroatom(s) may be N, O, S, Si, or P.

As used herein, when a definition is not otherwise provided, "aliphatic" refers to a C1 to C30 linear or branched alkyl, alkenyl, or alkynyl group.

As used herein, when a definition is not otherwise provided, "aromatic" refers to a C6 to C30 aryl group or a C2 to C30 heteroaryl group.

As used herein, when a definition is not otherwise provided, "heteroaryl" refers to an aromatic group that comprises at least one heteroatom covalently bonded to one or more carbon atoms of aromatic ring.

As used herein, when a definition is not otherwise provided, "alicyclic" refers to a C3 to C30 cycloalkyl group, a C3 to C30 cycloalkenyl group, or a C3 to C30 cycloalkynyl group.

As used herein, when a definition is not otherwise provided, "(meth)acrylate" refers to acrylate, methacrylate, or a combination thereof.

In an embodiment, "hydrophobic moiety" may be a moiety providing the corresponding compound with a tendency to be agglomerated in an aqueous solution and to repel water. For example, the hydrophobic moiety may include an aliphatic hydrocarbon group having a carbon number of 1 or greater (e.g., 2 or greater, 3 or greater, 4 or greater, or 5 or greater) (alkyl, alkenyl, alkynyl, etc.), an aromatic hydrocarbon group having a carbon number of 6 or greater (phenyl, naphthyl, alkylaryl group, etc.), or an alicyclic hydrocarbon group having a carbon number of 5 or greater (cyclohexyl, norbornene, norbornane, tricyclodecane, etc.).

As used herein, "dispersion" refers to dispersion wherein a dispersed phase is a solid and a continuous phase includes a liquid. For example, "dispersion" may refer to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., less than or equal to about 2 μm, less than or equal to about 1 μm, or less than or equal to about 0.5 μm).

As used herein, the term "Group" refers to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

As used herein, "tail" refers to a portion of a photoluminescent spectrum curve present in a wavelength region that is at least 40 nm (e.g., at least 41 nm, at least 42 nm, at least 43 nm, at least 44 nm, at least 45 nm, at least 46 nm, at least 47 nm, at least 48 nm, at least 49 nm, or at least 50 nm) greater than a maximum luminescent peak wavelength. A tail initiation wavelength is a wavelength at which the tail begins.

As used herein, the term "monolayer" is a shell thickness measurement unit. The monolayer may calculated from a bulk crystal structure (e.g., cubic lattice structure) of a given shell material (e.g., ZnS, ZnSe) as the closest distance between related lattice planes (e.g., the distance between adjacent lattice planes in the [111] direction). For example, in case of cubic ZnSe and ZnS, one monolayer may correspond to 0.328 nm and 0.31 nm thickness, respectively.

A semiconductor nanocrystal particle (also known as quantum dots) is a crystalline material having a size of several nanometers. The semiconductor nanocrystals particle may have a large surface area per a unit volume due to very small sizes and may exhibit different characteristics from bulk materials having the same composition due to a quantum confinement effect. Quantum dots may absorb light from an excitation source to be excited, and may emit energy corresponding to energy bandgaps of the quantum dots. The quantum dots have a potential applicability to various devices (e.g., an electronic device) due to unique photoluminescence characteristics. The quantum dots having properties currently applicable to an electronic device and the like are mostly cadmium-based quantum dots. However, cadmium may cause serious environment/health problems and thus is a restricted element. A non-cadmium-based (cadmium-free) quantum dot is a Group III-V-based nanocrystal. However, the non-cadmium-based quantum dot may have insufficient photoluminescence properties (e.g., a full width at half maximum (FWHM) and luminous efficiency) compared with those of a cadmium-based quantum dot.

A quantum dot according to an embodiment includes a semiconductor nanocrystal core and a semiconductor nanocrystal shell disposed on the core and does not include cadmium. The core includes a Group III-V compound, the quantum dot has a maximum photoluminescence peak in a green light wavelength region, and a full width at half maximum (FWHM) of the maximum photoluminescence peak is less than or equal to about 50 nm. The quantum dot has a difference (hereinafter, referred to as a Stokes shift) between a wavelength of the maximum photoluminescence peak and a first absorption peak wavelength is less than or equal to about 25 nm. The quantum dot according to an embodiment may include indium and zinc.

The green light wavelength region may be greater than or equal to about 500 nm, for example, greater than or equal to about 510 nm, greater than or equal to about 520 nm, or greater than or equal to about 530 nm. The green light wavelength region may be less than or equal to about 560 nm, for example, less than or equal to about 550 nm or less than or equal to about 540 nm. The first absorption peak may be greater than or equal to about 490 nm, for example, greater than or equal to about 495 nm, or greater than or equal to about 500 nm. The first absorption peak may be less than or equal to the wavelength of the maximum photoluminescence peak. For example, the first absorption peak may be less than or equal to about 550 nm, less than or equal to about 540 nm, or less than or equal to about 530 nm.

Herein, the "first absorption peak (first excitation absorption peak)" refers to a main peak appearing first from a lower energy region in a UV-Vis absorption spectrum.

The non-cadmium quantum dot (e.g., based on a Group III-V compound including indium (In) and phosphorus (P)) has more traps and is more difficult to uniformly grow and thus has a wider full width at half maximum (FWHM) than a cadmium quantum dot such as CdSe and the like. In addition, as a core including indium (In) and phosphorus (P) may be susceptible to a surface oxidization, the non-cadmium quantum dot may not simultaneously exhibit desired values of quantum efficiency and a full width at half maximum (FWHM) even after coating a shell on the core. Accordingly, when applied to, e.g., used in, a display device, the non-cadmium quantum dot may have difficulties exhibiting a desired color reproducibility (e.g., under the next generation BT2020).

In a quantum dot, a Stokes shift refers to a difference between absorption energy and photoluminescence energy. The Stokes shift may be represented by a difference between a first absorption peak wavelength (nm) (or energy, microelectronvolts (meV)) in a UV-Vis absorption spectrum and a maximum photoluminescence peak wavelength (energy) in a photoluminescence spectrum. Without wishing to be bound any theory, it is believed that the Stokes shift may depend on a size and/or a composition (e.g., whether an additional element is present or not) of quantum dot particles. Without wishing to be bound any theory, it is believed that a surface state of the quantum dots also may have an influence on the Stokes shift. For example, the Stokes shift of the quantum dot may represent a composition, a surface state, or a combination thereof of the quantum dot.

A size, a composition, and a surface of each individual quantum dot may have an influence on a Stokes shift of a population thereof. The present inventors have found that a Stokes shift of a core/shell quantum dot may have a direct influence on color reproducibility of a device including the quantum dot. The quantum dots according to an embodiment (e.g., when the quantum dots form a population) may exhibit a relatively low value of the Stokes shift, and when applied to, e.g., used in, a display device, the quantum dots of an embodiment may exhibit improved color reproducibility.

The present inventors have found that the Stokes shift may relate to defects, a (average) particle size, a size distribution, or a combination thereof of the quantum dot, and under the assumption that there are no substantial changes in the size and the distribution of the quantum dots, the Stokes shift may provide an indication as to the effects the defects of the quantum dot have on the luminous properties thereof. According to the research of the present inventors, in comparison with red light emitting quantum dots, luminous properties (e.g., FWHM and luminous efficiency) of green light emitting quantum dots may be more susceptible to the presence of the defects of the quantum dot. In addition, the defects of the quantum dot may result in an increase of a trap emission, leading to an increase of a longer wavelength tail in a photoluminescent spectrum thereof.

When the quantum dots are used in a display device as a luminous material, the increase of the longer wavelength tail of the photoluminescence (PL) peak of the quantum dot may cause a problem of a mixed light of red and green wavelength regions, which may have an (e.g., seriously) adverse effect on the color reproducibility of the device.

The quantum dots of an embodiment may be prepared in the method (e.g., including a Group III metal rich environment, a controlled addition, e.g., injection, of a Group V element precursor, and addition of the aforementioned additives) which will be explained in detail below. The present inventors have found that in a reaction system for a synthesis of a Group III-V compound-based core (e.g., an indium phosphide-based quantum dot), an amount of the Group V element precursor may be changed (e.g., be exhausted) uncontrollably and dramatically, which may considerably contribute to an increase of the defect number in a resulting quantum dot.

Without wishing to be bound any theory, the method that will be described later may help control of the amount of the Group V element in the reaction system for the core and thereby the resulting quantum dot may have a reduced, e.g., decreased, number of defects. In addition, during the synthesis of the core, the shell, or a combination thereof, adding, e.g., injecting, the additive in an amount as described below may bring forth enhanced luminous properties (e.g., Stokes shift, a PL quantum yield (QY), or a FWHM) without a substantial change in the luminescent wavelength (e.g., a bandgap) of a (green light emitting) quantum dot.

In the method that will be described later, the Group V element precursor (e.g., the phosphorous precursor) may be further added at an appropriate time during the synthesis of the core in addition to a nucleation period thereof, whereby a sharp and dramatic change in an amount of the precursor may be suppressed and the resulting quantum dot may exhibit a reduced, e.g., decreased, Stokes shift. Moreover, the aforementioned additive included in the quantum dot (e.g., the core) may have an electronegativity that is greater than or equal to that of the Group IV element such as tin (e.g., 1.96 for Sn) and less than or equal to about that of a given Group V element (e.g., 2.19 for phosphorous), and may also contribute to a decrease in the Stokes shift.

In summary, without wishing to be bound any theory, it is believed that the production environment that will be described later may relate to, e.g., affect, the properties of the quantum dot (e.g., reducing or decreasing the number of the defects on a surface of the quantum dot), which may contribute to a reduced level of the, e.g., decreased, Stokes shift that may not otherwise be achieved by non-cadmium quantum dots. In addition, the quantum dot of an embodiment may have a decreased, e.g., shorter, tail of, e.g., in, a longer wavelength region in a photoluminescent spectrum of the quantum dot and a reduced, e.g., decreased, FWHM together with an increased quantum efficiency. For a green light emitting quantum dot, the decreased, e.g., shorter, tail of the longer wavelength region of the PL peak may effectively suppress a mixing of light with a red light emission of a device and when applied in the device, the quantum dot of an embodiment and a quantum dot polymer composite including the same may exhibit improved color reproducibility.

In an embodiment, the quantum dot may have a Stokes shift of less than or equal to about 25 nm, less than or equal to about 25 nm, less than or equal to about 23 nm, less than or equal to about 22 nm, less than or equal to about 21 nm, less than or equal to about 20 nm, or less than or equal to about 19 nm. The Stokes shift may be greater than or equal to about 5 nm, greater than or equal to about 6 nm, greater than or equal to about 7 nm, greater than or equal to about 8 nm, greater than or equal to about 9 nm, or greater than or equal to about 10 nm.

In terms of an energy level, the quantum dot may have a Stokes shift of less than or equal to about 0.15 eV, less than or equal to about 0.145 eV, less than or equal to about 0.14 eV, less than or equal to about 0.135 eV, less than or equal to about 0.13 eV, less than or equal to about 0.125 eV, less than or equal to about 0.12 eV, less than or equal to about 0.115 eV, less than or equal to about 0.11 eV, less than or equal to about 0.105 eV, less than or equal to about 0.1 eV, less than or equal to about 0.095 eV, less than or equal to about 0.09 eV, or less than or equal to about 0.085 eV.

In an embodiment, the quantum dot may exhibit enhanced optical properties.

In an embodiment, a maximum photoluminescent peak of the quantum dot may have a FWHM of less than or equal to about 35 nm, less than or equal to about 34 nm, 33 nm, less than or equal to about 32 nm, or less than or equal to about 31 nm.

In an embodiment, a quantum yield of a quantum dot may be greater than or equal to about 80%, greater than or equal to about 81%, greater than or equal to about 83%, greater than or equal to about 84%, greater than or equal to about 85%, or greater than or equal to about 86%.

The quantum dots may be included in a (organic) solution or a composite (e.g., when they are subjected to an optical property analysis). The solution including the quantum dots may have an optical density or absorptance that is greater than or equal to about 5%, greater than or equal to about 10%, greater than or equal to about 15%, greater than or equal to about 20%, greater than or equal to about 25%, greater than or equal to about 30%, greater than or equal to about 35%, greater than or equal to about 40%, greater than or equal to about 45%, greater than or equal to about 50%, greater than or equal to about 55%, greater than or equal to about 60%, greater than or equal to about 65%, greater than or equal to about 70%, greater than or equal to about 75%, greater than or equal to about 80%, or greater than or equal to about 85% and less than or equal to about 100%, less than or equal to about 90%, less than or equal to about 80%, less than or equal to about 70%, less than or equal to about 60%, less than or equal to about 50%, less than or equal to about 40%, less than or equal to about 30%, less than or equal to about 20%, or less than or equal to about 10%.

In a photoluminescent spectrum of the quantum dot, a ratio of a (predetermined) tail area with respect to a total area of a PL peak curve may be less than or equal to about 10%, less than or equal to about 9%, less than or equal to about 8%, less than or equal to about 7%, less than or equal to about 6%, less than or equal to about 5%, or less than or equal to about 4%.

In a photoluminescent spectrum of the quantum dot, a ratio of an intensity at a tail initiation wavelength with respect to an intensity of a maximum PL peak may be less than or equal to about 0.12, for example, less than or equal to about 0.11, less than or equal to about 0.1, less than or equal to about 0.9, less than or equal to about 0.8, less than or equal to about 0.7, less than or equal to about 0.6, or less than or equal to about 0.5.

The quantum dot having the aforementioned properties may exhibit enhanced stokes shift and narrowed FWHM even without an aid of a color filter (for example, blocking blue light, green light, and/or red light) when they are applied in a display device (in a form of a composite film or a single layer), whereby achieving increased brightness (without luminance loss thereof due to the presence of a color filter. In addition, when being applied to a display, the quantum dots may show improved color purity and prevent a color mixing so that even without a color filter, they may achieve enhanced color gamut of greater than or equal to about 80%, greater than or equal to about 85%, greater than or equal to about 89%, or greater than or equal to about 90%.

In an embodiment, the semiconductor nanocrystal core may include indium. The semiconductor nanocrystal core may include phosphorus. The semiconductor nanocrystal core may include InP, InAs, GaP, GaAs, or a combination thereof. In an embodiment, the quantum dot may include a semiconductor nanocrystal core including indium phosphide (e.g., InP). The semiconductor nanocrystal core may further include zinc.

When the core includes zinc, an amount of the zinc may be greater than 0, greater than or equal to about 0.001 moles, greater than or equal to about 0.005 moles, greater than or equal to about 0.01 moles, greater than or equal to about 0.05 moles, greater than or equal to about 0.1 moles, greater than or equal to about 0.5 moles, or greater than or equal to about 1 mole and less than or equal to about 5 moles, less than or equal to about 3 moles, less than or equal to about 1 mole, less than or equal to about 0.9 moles, less than or equal to about 0.7 moles, less than or equal to about 0.5 moles, less than or equal to about 0.3 moles, or less than or equal to about 0.1 moles per one mole of indium.

The semiconductor nanocrystal core may further include a Group IV element. The Group IV element may include tin (Sn).

In the quantum dot according to an embodiment, an amount of the Group IV element may be greater than or equal to about 0.00001 moles, greater than or equal to about 0.00005 moles, greater than or equal to about 0.0001 mole, greater than or equal to about 0.0005 moles, greater than or equal to about 0.001 moles, greater than or equal to about 0.0015 moles, greater than or equal to about 0.002 moles, greater than or equal to about 0.003 moles, greater than or equal to about 0.004 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, or greater than or equal to about 0.1 mole and less than or equal to about 1 mole, less than or equal to about 0.9 moles, less than or equal to about 0.8 moles, less than or equal to about 0.7 moles, less than or equal to about 0.6 moles, less than or equal to about 0.5 moles, less than or equal to about 0.4 moles, less than or equal to about 0.3 moles, less than or equal to about 0.2 moles, less than or equal to about 0.1 moles, less than or equal to about 0.09 moles, less than or equal to about 0.08 moles, less than or equal to about 0.07 moles, less than or equal to about 0.06 moles, less than or equal to about 0.05 moles, less than or equal to about 0.04 moles, less than or equal to about 0.03 moles, less than or equal to about 0.02 moles, less than or equal to about 0.015 moles, less than or equal to about 0.01 moles, less than or equal to about 0.009 moles, less than or equal to about 0.008 moles, less than or equal to about 0.007 moles, less than or equal to about 0.006 moles, less than or equal to about 0.005 moles, less than or equal to about 0.004 moles, less than or equal to about 0.003 moles, less than or equal to about 0.002 moles, or less than or equal to about 0.001 moles per 1 mole of indium. The presence and amount of the Group IV element may be confirmed by desirable methods such as X-ray photoelectron spectroscopy (XPS) or inductively coupled plasma atomic emission spectroscopy (ICP-AES).

The size of the core may be appropriately selected considering a photoluminescence wavelength. For example, the size of the core may be greater than or equal to about 1 nm, for example, greater than or equal to about 1.1 nm, greater than or equal to about 1.2 nm, greater than or equal to about 1.3 nm, greater than or equal to about 1.4 nm, greater than or equal to about 1.5 nm, greater than or equal to about 1.6 nm, greater than or equal to about 1.7 nm, greater than or equal to about 1.8 nm, greater than or equal to about 1.9 nm, or greater than or equal to about 2 nm. For example, the size of the core may be less than or equal to about 5 nm, for example, less than or equal to about 4.5 nm, less than or equal to about 4 nm, less than or equal to about 3.5 nm, or less than or equal to about 3 nm.

The quantum dot according to an embodiment may have a core-multi-layered shell structure. The semiconductor nanocrystal shell may include a first semiconductor nanocrystal shell including zinc and selenium. The shell may include a second semiconductor nanocrystal shell disposed on the first semiconductor nanocrystal shell and including zinc and sulfur. For example, the quantum dot may include a first shell directly on the core and including ZnSe, ZnSeS, or a combination thereof. The quantum dot may have a core-multi-layered shell structure having a second shell directly on the first shell, having a different composition from the first shell, and including ZnS, ZnSeS, or a combination thereof.

The first semiconductor nanocrystal shell may include ZnSe. The first semiconductor nanocrystal shell may not include sulfur (S). For example, the first semiconductor nanocrystal shell may not include ZnSeS. In an embodiment, the semiconductor nanocrystal shell may include ZnSeS. The first semiconductor nanocrystal shell may be disposed directly on the semiconductor nanocrystal core. The first semiconductor nanocrystal shell may have a thickness of greater than or equal to about 1 monolayer (ML), greater than or equal to about 1.5 ML, greater than or equal to about 2 ML, greater than or equal to about 2.5 ML, greater than or equal to about 3 ML, or greater than or equal to about 4 ML. The first semiconductor nanocrystal shell may have a thickness of less than or equal to about 10 ML, for example, less than or equal to about 9 ML, less than or equal to about 8 ML, or less than or equal to about 7 ML.

In an embodiment, a thickness of the first semiconductor nanocrystal shell may be greater than or equal to about 1 nm, greater than or equal to about 1.1 nm, greater than or equal to about 1.2 nm, greater than or equal to about 1.3 nm, greater than or equal to about 1.4 nm, or greater than or equal to about 1.5 nm. The thickness of the first semiconductor nanocrystal shell may be less than or equal to about 3.5 nm, less than or equal to about 3 nm, less than or equal to about 2.5 nm, less than or equal to about 2 nm, or less than or equal to about 1.5 nm.

In another embodiment, a thickness of the first semiconductor nanocrystal shell may be less than or equal to about 1 nm, for example, less than or equal to about 0.9 nm, less than or equal to about 0.8 nm, less than or equal to about 0.7 nm, or less than or equal to about 0.65 nm.

Without being bound by any particular theory, it is believed that the quantum dot according to an embodiment includes a first semiconductor nanocrystal shell having a relatively increased thickness, and the shell may contribute to shell uniformity and improving optical properties of the quantum dot.

The second semiconductor nanocrystal shell may be an outermost layer of the quantum dot. The second semiconductor nanocrystal shell may be disposed directly on the first semiconductor nanocrystal shell. The second semiconductor nanocrystal shell may include ZnSeS, ZnS, or a combination thereof. The second semiconductor nanocrystal shell may have a changed composition in a radial direction. The second semiconductor nanocrystal shell may have a concentration gradient of sulfur that is increased toward the surface of the quantum dot. In an embodiment, a thickness of the second semiconductor nanocrystal shell may be greater than or equal to about 1 nm, for example, greater than or equal to about 0.9 nm, greater than or equal to about 0.8 nm, greater than or equal to about 0.7 nm, or greater than or equal to about 0.65 nm. In another embodiment, a thickness of the second semiconductor nanocrystal shell may be less than or equal to about 1 nm, for example, less than or equal to about 0.9 nm, less than or equal to about 0.8 nm, less than or equal to about 0.7 nm, less than or equal to about 0.65 nm.

In the quantum dot according to an embodiment, the core may include indium, phosphorus, and optionally zinc and the shell may include zinc, sulfur, and selenium.

In the quantum dot, a mole ratio of sulfur, and selenium relative to indium may be greater than or equal to about 20:1, for example, greater than or equal to about 21:1, greater than or equal to about 22:1, greater than or equal to about 23:1, greater than or equal to about 24:1, greater than or equal to about 25:1, or greater than or equal to about 26:1 and less than or equal to about 36:1, less than or equal to about 35:1, less than or equal to about 34:1, less than or equal to about 33:1, less than or equal to about 32:1, less than or equal to about 31:1, less than or equal to about 30:1, or less than or equal to about 29:1.

In the quantum dot, a mole ratio of phosphorus relative to indium may be greater than or equal to about 0.6:1, for example, greater than or equal to about 0.65:1, or greater than or equal to about 0.7:1. In the quantum dot, a mole ratio of phosphorus relative to indium may be less than or equal to about 1.5, less than or equal to about 1.4, less than or equal to about 1.3, less than or equal to about 1.2, less than or equal to about 1.1, less than or equal to about 1, less than or equal to about 0.9:1, for example, less than or equal to about 0.87:1, less than or equal to about 0.85:1, less than or equal to about 0.8:1, or less than or equal to about 0.78:1.

In the quantum dot, a mole ratio of zinc relative to indium may be greater than or equal to about 25:1, greater than or equal to about 26:1, greater than or equal to about 27:1, greater than or equal to about 28:1, greater than or equal to about 29:1 and less than or equal to about 45:1, less than or equal to about 44:1, less than or equal to about 43:1, less than or equal to about 42:1, less than or equal to about 41:1, less than or equal to about 40:1, less than or equal to about 39:1, less than or equal to about 38:1, less than or equal to about 37:1, less than or equal to about 36:1, or less than or equal to about 35:1.

In the quantum dot, a mole ratio of selenium relative to sulfur (Se/S) may be greater than or equal to about 0.80:1, for example, greater than or equal to about 0.85:1, or greater than or equal to about 0.89:1 and less than or equal to about 2:1, for example, less than or equal to about 1.5:1.

Without being bound by any particular theory, the quantum dots having the aforementioned composition and produced by the production method that will be described later may exhibit decreased Stokes shift.

The quantum dot may have a (average) size of greater than or equal to about 2 nm, for example, greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 7.5 nm, or greater than or equal to about 8 nm. The quantum dot may have a (average) size of less than or equal to about 30 nm, for example, less than or equal to about 20 nm, less than or equal to about 15 nm, less than or equal to about 10 nm, less than or equal to about 9 nm, less than or equal to about 8 nm, or less than or equal to about 7.5 nm. The size of the quantum dot may be a particle diameter.

The size of the quantum dot may be a diameter. For a non-spherical shape, the size of the quantum dot may be an equivalent diameter, which is calculated from a two-dimensional area confirmed by a transmission electron microscope analysis. The size of the quantum dot may be measured by averaging long-axis and short-axis sizes. A shape of the quantum dot is not particularly limited, may, for example, be a spherical, polyhedron, pyramid, multipod, or cube shape, nanotube, nanowire, nanofiber, nanosheet, or a combination thereof, but is not limited thereto. The quantum dot may include the organic ligand, the organic solvent, or a combination thereof which will be described later, on a surface of the quantum dot. The organic ligand, the organic solvent, or a combination thereof may be bound to the surface of the quantum dot.

The quantum dot according to an embodiment may be applied as a sheet or as a patterned film to a display device. In an embodiment, the sheet or the patterned film may include a quantum dot-polymer composite. For example, a display device including a quantum dot-based color filter may provide improved display quality in terms of color purity, luminance, and the like. The present inventors have found that the quantum dot according to an embodiment may exhibit a decreased, e.g., level of a, Stokes shift and accordingly, may exhibit much improved color reproducibility. Accordingly, the quantum dot according to an embodiment may exhibit improved color reproducibility based on BT2020, which is a next generation standard of a display device.

An embodiment provides a method of producing the aforementioned quantum dot, which includes:
preparing a semiconductor nanocrystal core including a Group III-V compound including a Group III metal and a Group V element;
preparing a first solution including a shell metal precursor and an organic ligand;
adding a semiconductor nanocrystal core including a Group III-V compound to the first solution, e.g., injecting a semiconductor nanocrystal core including a Group III-V compound into the first solution, at a first temperature; and
heating the first solution including the semiconductor nanocrystal core to a second temperature and adding a shell non-metal precursor to the first solution, e.g., injecting a shell non-metal precursor into the first solution, to form a semiconductor nanocrystal shell on the surface of the semiconductor nanocrystal core.

During the formation of the semiconductor nanocrystal core and/or the formation of the shell, a group V precursor (e.g., a phosphorous precursor) may be added at least twice (e.g., injected in a split manner).

The first temperature is less than or equal to about 150° C. The second temperature may be greater than or equal to about 250° C., for example, greater than or equal to about 260° C., greater than or equal to about 270° C., greater than or equal to about 280° C., or greater than or equal to about 290° C. and less than or equal to 350° C., for example, less than or equal to about 340° C., or less than or equal to about 330° C.

The composition of the quantum dot, the semiconductor nanocrystal core, and the semiconductor nanocrystal shell are the same as described above.

In an embodiment, the first temperature may be greater than or equal to about 50° C., for example, greater than or equal to about 80° C., or greater than or equal to about 90° C. The first temperature may be less than or equal to about 140° C., for example, less than or equal to about 130° C., less than or equal to about 120° C., or less than or equal to about 110° C. The second temperature may be greater than or equal to about 250° C., for example, greater than or equal to about 260° C., greater than or equal to about 270° C., greater than or equal to about 280° C., greater than or equal to about 290° C., greater than or equal to about 300° C., or greater than or equal to about 310° C. The second temperature may be less than or equal to about 330° C., for example, less than or equal to about 325° C.

In the method, types and amounts of the semiconductor nanocrystal core, the shell metal precursor, and the shell non-metal precursor may be selected considering a composition and a size of a desirable final quantum dot. For example, when the core includes indium, phosphorus, and optionally, zinc, and the shell includes zinc, sulfur, and selenium, each of the amounts of a zinc-containing precursor, a selenium-containing precursor, and a sulfur-containing precursor with respect to the core may be controlled so that the resulting quantum dot may have the aforementioned ratios for the zinc, the selenium, and the sulfur relative to indium, respectively.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RHPOOH, $R_2POOH$, wherein, R is the same or different and are independently hydrogen, a C1 to C40 (e.g., C3-C24) aliphatic hydrocarbon group (e.g., an alkyl group, an alkenyl group, or an alkynyl group), or a C6 to C20 aromatic hydrocarbon (e.g., an aryl group), wherein in the organic ligand, at least one R is not hydrogen), or a combination thereof. The organic ligand may be a mixture of RCOOH and $RNH_2$.

The organic ligand may coordinate, e.g., be bound to, the surface of the obtained nanocrystal and may aid in dispersibility of the nanocrystal in the solution, affect light emitting and electrical characteristics of quantum dots, or a combination thereof. Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine or aminophosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, or substituted or unsubstituted octylphosphine (e.g., trioctylphosphine (TOP)); phosphine oxide such as substituted or unsubstituted methyl phosphine oxide (e.g., trimethyl phosphine oxide, methyldiphenyl phosphineoxide, etc.), substituted or unsubstituted ethyl phosphine oxide (e.g., triethyl phosphine oxide, ethyldiphenyl phosphineoxide, etc.), substituted or unsubstituted propyl phosphine oxide, substituted or unsubstituted butyl phosphine oxide, or substituted or unsubstituted octyl phosphine oxide (e.g., trioctylphosphineoxide (TOPO); a diphenyl phosphine or triphenyl phosphine compound, or an oxide compound thereof; phosphonic acid, and the like, but are not limited thereto. One or more organic ligands may be used. In an embodiment, the organic ligand may be a mixture of a fatty acid and an aliphatic primary amine.

A solvent for forming the first solution may be appropriately selected. The solvent may be an organic solvent. The organic solvent may include a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether; or a combination thereof. Types and amounts of the solvent may be appropriately selected considering precursors and organic ligands.

The first solution may be heated at a predetermined temperature, for example, greater than or equal to about 100° C. and less than or equal to about 150° C., under vacuum, inert atmosphere, or a combination thereof.

The core according to an embodiment may be formed in a hot addition, e.g., hot injection method wherein a group V element precursor (e.g., a phosphorus precursor) is added to, e.g., injected into, a heated solution including a metal precursor such as an indium precursor, and optionally a ligand, and optionally a zinc precursor at a high temperature (e.g., greater than or equal to about 200° C.).

Injection of the group V element precursor (e.g., a phosphorus precursor) may be carried out at least twice (e.g., in a split manner) (for example, at a core nucleation and thereafter in an appropriate interval). In an embodiment, the injection time and/or the injected amount may be controlled appropriately.

In an embodiment, the core may be prepared in a heating up method wherein the reactants are mixed and dissolved first and then heated together.

Same or different amounts of the group V precursor (e.g., the phosphorus precursor) may be added to, e.g., injected into, the heated solution a plurality of times (e.g., at least twice such as at the initiation and a latter portion of the reaction). For example, when the group V element precursors are added twice, a ratio between the amounts added in each time may be 1:0.1 to 1:10.

The phosphorus precursor may include at least two (e.g., three, four, or more) different phosphorous compounds.

The phosphorus precursor may include white phosphorous, red phosphorous, mono-, di-, tri-substituted or unsubstituted alkyl phosphines such as a tris(alkylsilyl) phosphine (e.g., tris(trialkylsilyl) phosphine), tricyclohexylphosphine, cyclohexyl dimethylphosphine, dietheylhexylphosphine, dimethylethylphosphine, diethylmethylphosphine, diehtylcarboxymethylphosphine, dialkylaminoalkyl phosphines, diarylphosphines, dialkyl phosphines, trialkylphosphines, triarylphosphines (e.g., triphenyl phosphine), or a combination thereof.

The metal (e.g., indium) precursor may be in a form of metal (e.g., a metal powder), an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof. In an embodiment, the metal (e.g., indium) precursor may be present in an excess amount of the Group V element (e.g., phosphorous) precursor.

When the core further includes the aforementioned additive (e.g., an Group 4 element such as Sn(tin), As, Sb, Bi, or Te), a precursor of the additive may be further added at an appropriate time (e.g., the nucleation step, a latter portion, or in the middle) during the core synthesis. The precursor for the additive may be in an appropriate compound form. The precursor may be a carboxylate, an alkyl halide, or the like. The precursor for the additive may be a tin carboxylate (e.g., tin acetate), an alkyl tin chloride (e.g., dimethyltin dichloride), or the like.

In an embodiment, the addition of the aforementioned additive may contribute to keeping, e.g., maintaining, the amount of the Group V element precursor at a controlled level during the core synthesis without causing a substantial change in a luminous wavelength of the quantum dot and decreasing the number of the defects in the prepared core (and the shell subsequently formed).

The amount of the precursor for the additive may be controlled appropriately. In an embodiment, the amount of the additive precursor may be greater than or equal to about 0.001 moles, for example, greater than or equal to about 0.005 moles, or greater than or equal to about 0.01 moles and less than or equal to about 0.1 moles, less than or equal to about 0.09 moles, less than or equal to about 0.08 moles, less than or equal to about 0.07 moles, less than or equal to about 0.06 moles, less than or equal to about 0.05 moles, less than or equal to about 0.04 moles, less than or equal to about 0.03 moles, less than or equal to about 0.02 moles, or less than or equal to about 0.01 moles with respect to one mole of the Group III metal. Within the aforementioned range, a desired value of the Stokes shift may be achieved without any substantial decrease in a luminous efficiency of the quantum dot.

The shell metal precursor may be a zinc-containing precursor. The zinc-containing precursor is not particularly limited and may be appropriately selected. For example, the zinc-containing precursor may be a Zn metal powder, an alkylated Zn compound, a Zn alkoxide, a Zn carboxylate, a Zn nitrate, a Zn perchlorate, a Zn sulfate, a Zn acetylacetonate, a Zn halide, a Zn cyanide, a Zn hydroxide, a Zn oxide, a Zn peroxide, zinc carbonate, or a combination thereof. Examples of the shell metal precursor may be dimethyl zinc, diethyl zinc, zinc acetate, zinc acetylacetonate, zinc iodide, zinc bromide, zinc chloride, zinc fluoride, zinc carbonate, zin cyanide, zinc nitrate, zinc oxide, zinc peroxide, zinc perchlorate, zinc sulfate, and the like. One or more first shell precursors may be used.

The shell non-metal precursor may include a selenium-containing precursor and a sulfur-containing precursor.

Types of the selenium-containing precursor are not particularly limited and may be selected appropriately. For example, the selenium-containing precursor includes selenium-trioctyl phosphine (Se-TOP), selenium-tributyl phosphine (Se-TBP), selenium-triphenyl phosphine (Se-TPP), or a combination thereof but is not limited thereto.

The sulfur-containing precursor is not particularly limited and may be appropriately selected. The sulfur-containing precursor may be hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfide, ammonium sulfide, sodium sulfide, or a combination thereof. The sulfur-containing precursor may be added to, e.g., injected into, the first solution once or more (e.g., twice or more). The forming of the semiconductor nanocrystal shell may include further adding the shell non-metal precursor and optionally a shell metal precursor to the first solution, e.g., injecting the shell non-metal precursor and optionally a shell metal precursor into the first solution, at least once, at least twice, at least three times, at least four times, at least five times, or more.

In the shell formation, a semiconductor nanocrystal shell of a final quantum dot may be formed to have a desired composition (e.g., the aforementioned first and second shells) by adjusting addition, e.g., injection, orders and amounts of the shell non-metal precursors to the first solution. In an embodiment, the formation of the semiconductor nanocrystal shell may include forming a first semiconductor nanocrystal shell on the semiconductor nanocrystal core by reacting a zinc-containing precursor and a selenium-containing precursor at a first reaction temperature for greater than or equal to about 40 minutes; and forming a second semiconductor nanocrystal shell on the first semiconductor nanocrystal shell by reacting a zinc-containing precursor and a sulfur-containing precursor at a second reaction temperature under the presence of a particle having the first semiconductor nanocrystal shell in an organic solvent and an organic ligand.

In the shell formation, a core-adding, e.g., core-injecting, temperature (e.g., first temperature) may be controlled appropriately, as above. For example, the core may be added to, e.g., injected into, the first solution at a temperature of greater than or equal to about 80° C., greater than or equal to about 90° C., greater than or equal to about 100° C., greater than or equal to about 110° C., greater than or equal to about 120° C., greater than or equal to about 130° C., or greater than or equal to about 140° C. The core may be added to, e.g., injected into, the first solution at a temperature of less than or equal to about 150° C., less than or equal to about 140° C., less than or equal to about 130° C., less than or equal to about 120° C., or less than or equal to about 110° C.

A temperature for the shell formation (e.g., the second reaction temperature) may be appropriately selected. For example, the temperature for the shell formation may be greater than or equal to about 250° C., for example, greater than or equal to about 260° C., greater than or equal to about 270° C., greater than or equal to about 280° C., greater than or equal to about 290° C., greater than or equal to about 300° C., greater than or equal to about 310° C., or greater than or equal to about 315° C. The shell non-metal precursor and the shell metal precursor optionally added thereto are at least once (e.g., at least twice or at least three times) added to, e.g., injected into, the first solution after heating of the solution has been completed or while heating the first solution to the reaction temperature.

Reaction time for the shell formation (e.g., the first shell, the second shell, or a combination thereof) may be appropriately adjusted but is not particularly limited. A thickness of the first/second semiconductor nanocrystal shell(s) may be adjusted through a reaction at the shell-forming reaction temperature for predetermined reaction time.

In the method according to an embodiment, a content of a shell metal/non-metal precursor per 1 mole of a Group III metal (e.g., indium) included in the core in a reaction system may be selected. For example, when a ZnSe shell is formed on an indium-containing core, an amount of a selenium precursor relative to that of indium may be adjusted to form a first semiconductor nanocrystal shell having a predetermined thickness for predetermined reaction time. For example, selenium may be used in a range of greater than or equal to about 5.5 moles and less than or equal to about 10 moles per about 1 mole of indium in the reaction system. An amount of a sulfur precursor relative to indium may be adjusted to form a second semiconductor nanocrystal shell having a predetermined thickness and composition for a predetermined reaction time. In an embodiment, sulfur is used in an amount of greater than or equal to about 25 moles and less than or equal to about 45 moles per 1 mole of indium.

The method may not include decreasing a temperature of a reaction solution including a particle having the first semiconductor nanocrystal shell down to less than or equal to about 50° C. (e.g., less than or equal to about 30° C. or room temperature).

The method may further include adding an additive comprising ammonium fluoride, a Group IV element, or a combination thereof to the first solution, e.g., injecting ammonium fluoride, a Group IV element, or a combination thereof into the first solution, during formation of the semiconductor nanocrystal shell. The manner of the addition (e.g., the time for the addition) of the additive is not particularly limited. The additive may be added alone or a mixture of the other precursors (e.g., the sulfur and/or selenium precursor(s))

The amount of the additive (e.g., the ammonium fluoride) may be selected appropriately. An amount of the additive (e.g., the ammonium fluoride) may be greater than or equal to about 0.0001 mole, greater than or equal to about 0.0005 mole, greater than or equal to about 0.001 mole, greater than or equal to about 0.005 mole, greater than or equal to about 0.01 mole, greater than or equal to about 0.05 mole, greater than or equal to about 0.1 mole, greater than or equal to about 0.5 moles, greater than or equal to about 1 mole and less than or equal to about 5 moles, less than or equal to about 4 moles, less than or equal to about 3 moles, less than or equal to about 2 moles, less than or equal to about 1 moles, less than or equal to about 0.5 moles, or less than or equal to about 0.1 moles, based on 1 mole of a Group III metal (e.g., indium).

When the non-solvent is added into the obtained final reaction solution, the organic ligand-coordinated nanocrystal may be separated (e.g., precipitated). The non-solvent may be a polar solvent that is miscible with the solvent used in the reaction and nanocrystals are not dispersible therein. The non-solvent may be selected depending on the solvent used in the reaction and may be for example, acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing solvents, or a combination thereof. The separation may be performed through a centrifugation, precipitation, chromatography, or distillation. The separated nanocrystal may be added to a washing solvent and washed, if necessary. The washing solvent is not particularly limited and may have a similar solubility parameter to that of the ligand and may, for example, include hexane, heptane, octane, chloroform, toluene, benzene, and the like.

In an embodiment, a quantum dot composition includes the aforementioned quantum dots, optionally a dispersing agent for ensuring dispersion of the quantum dot or a binder polymer (e.g., including a carboxylic acid group), a polymerizable monomer (e.g., photopolymerizable monomer) including a carbon-carbon double bond, and an initiator (e.g., photoinitiator or thermal initiator). The composition may further include an organic solvent.

The composition according to an embodiment may be used for producing the pattern of the quantum dot-polymer composite. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing). The composition according to an embodiment may not include a conjugated polymer (except a cardo binder that will be described later). The composition according to an embodiment may include a conjugated polymer. Herein, the conjugated polymer may refer to a polymer having a conjugation double bond in a main chain of the polymer (e.g., polyphenylenevinylene, etc.).

In the composition, the quantum dot is the same as described above. In the composition, an amount of the quantum dot may be appropriately selected considering a final use and a composition of the composition. In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a solid content.

In the composition according to an embodiment, the dispersing agent is a compound capable of dispersing the quantum dot. The dispersing agent may include a binder polymer including a carboxylic acid group (hereinafter, may also be referred to as a carboxylic acid polymer or a binder including a carboxyl group). The binder polymer may be an insulating polymer. The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure where two aromatic rings are bound to a quaternary carbon atom that is a constituent atom of another cyclic moiety in the main chain and including a carboxylic acid group (—COOH); or a combination thereof.

Examples of the first monomer may include carboxylic acid vinyl ester compounds such as acrylic acid, methacrylic acid, maleic acid, itaconic acid, fumaric acid, 3-butenoic acid, and the like, but are not limited thereto. One or more first monomers may be used.

Examples of the second monomer may be an alkenyl aromatic compound such as vinyl acetate, vinyl benzoate, styrene, alpha-methyl styrene, vinyl toluene, or vinyl benzyl methyl ether; an unsaturated carboxylic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; an unsaturated carboxylic acid amino alkyl ester compound such as 2-amino ethyl acrylate, 2-amino ethyl methacrylate, 2-dimethyl amino ethyl acrylate, or 2-dimethyl amino ethyl methacrylate; a maleimide such as N-phenylmaleimide, N-benzylmaleimide, N-alkylmaleimide; an unsaturated carboxylic acid glycidyl ester compound such as glycidyl acrylate or glycidyl methacrylate; a vinyl cyanide compound such as acrylonitrile, methacrylonitrile; or an unsaturated amide compound such as acryl amide or methacryl amide, but are not limited thereto. One or more second monomers may be used.

Specific examples of the third monomer may include 2-hydroxy ethyl acrylate, 2-hydroxy ethyl methacrylate, 2-hydroxy butyl acrylate, or 2-hydroxy butyl methacrylate, but are not limited thereto. One or more third monomers may be used.

In the carboxylic acid polymer, an amount of a first repeating unit derived from the first monomer may be greater than or equal to about 10 mole percent (mol %), for example, greater than or equal to about 15 mol %, greater than or equal to about 25 mol %, or greater than or equal to about 35 mol %, based on a total number of moles in the carboxylic acid polymer. In the binder including a carboxyl group, an amount of the first repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %, based on a total number of moles in the binder including the carboxyl group.

In the carboxylic acid polymer, an amount of a second repeating unit derived from the second monomer may be greater than or equal to about 10 mol %, for example, greater than or equal to about 15 mol %, greater than or equal to about 25 mol %, or greater than or equal to about 35 mol %, based on a total number of moles in the carboxylic acid polymer. In the binder polymer, an amount of the second a repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %, based on a total number of moles in the binder polymer.

In the carboxylic acid polymer, an amount of a third repeating unit derived from the third monomer may be greater than or equal to about 1 mol %, for example, greater than or equal to about 5 mol %, greater than or equal to about 10 mol % or greater than or equal to about 15 mol %, based on a total number of moles in the carboxylic acid polymer, if the third repeating unit is present. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %, based on a total number of moles in the binder polymer.

The carboxylic acid polymer may be a copolymer of (meth)acrylic acid and at least one second/third monomer such as an aryl alkyl(meth)acrylate, a hydroxyalkyl (meth)acrylate, or styrene. For example, the binder polymer may be a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

The polymer including the carboxylic acid group may include a multiple aromatic ring-containing polymer. The multiple aromatic ring-containing polymer may be a cardo binder resin and may be commercially available.

The polymer including the carboxylic acid group may have an acid value of greater than or equal to about 50 milligrams of potassium hydroxide per gram (mg) KOH/g. For example, the carboxylic acid polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the polymer may be, for example, less than or equal to about 250 mg KOH/g, less than or equal to about for example, 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The binder polymer may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a weight average molecular weight of less than or equal to about 100,000 g/mol, for example, less than or equal to about 50,000 g/mol.

In the composition, an amount of the binder polymer or the dispersing agent may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight of the composition, but is not limited thereto. The amount of the binder polymer or the dispersing agent may be less than or equal to about 35 wt %, for example, less than or equal to about 33 wt %, or less than or equal to about 30 wt %, based on a total weight of the composition. Within the ranges, dispersion of the quantum dot may be ensured. The amount of the binder polymer may be about 0.5 wt % to about 55 wt %, based on a total weight of a solid content of the composition.

In the composition, the polymerizable monomer including a carbon-carbon double bond may include the photopolymerizable acrylic monomer. The polymerizable acrylic monomer may include a (C1 to C18 alkyl)(meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, pentaerythritol hexa(meth)acrylate, bisphenol A di(meth)acrylate, bisphenol A epoxy acrylate, trimethylolpropane tri(meth)acrylate, ethylene glycol monomethyl ether (meth)acrylate, novolac epoxy (meth)acrylate, diethylene glycol di(meth)acrylate, triethylene glycol di(meth)acrylate, propylene glycol di(meth)acrylate, tris(meth)acryloyloxyethyl phosphate, or a combination thereof.

An amount of the polymerizable monomer may be greater than or equal to about 0.5 wt %, for example, greater than or equal to about 1 wt % or greater than or equal to about 2 wt %, based on a total weight of the composition. The amount of the polymerizable monomer may be less than or equal to about 30 wt %, less than or equal to about for example, 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The initiator in the composition may be used for polymerization of the aforementioned monomers. The initiator is a compound capable of accelerating a radical reaction (e.g., radical polymerization of monomer) by producing radical chemical species under a mild condition (e.g., by heat or light). The initiator may be a thermal initiator or a photoinitiator. The thermal initiator may include azobisisobutyronitrile, benzoyl peroxide, and the like but is not limited thereto. The photoinitiator is a compound capable of initiating a radical polymerization of the aforementioned polymerizable acrylic monomer, a thiol compound (will be described later), or a combination thereof by light. The types of the photoinitiator are not particularly limited. The photoinitiator may include a triazine-based compound, an acetophenone compound, a benzophenone compound, a thioxanthone compound, a benzoin compound, an oxime ester compound, an aminoketone compound, a phosphine or phosphineoxide compound, a carbazole-based compound, a diketone compound, a sulfonium borate-based compound, a diazo-based compound, a biimidazole-based compound, or a combination thereof, but is not limited thereto. The initiator is not particularly limited.

In the composition, an amount of the initiator may be appropriately adjusted with a consideration to types and amounts of the polymerizable monomers. In an embodiment, the initiator may be used in an amount range of about 0.01 wt % to about 10 wt %, based on a total weight of the composition, but is not limited thereto.

The composition may further include a (multiple or mono-functional) thiol compound having at least one thiol group at the terminal end, a metal oxide fine particle, or a combination thereof.

The metal oxide fine particle may include $TiO_2$, $SiO_2$, $BaTiO_3$, $Ba_2TiO_4$, $ZnO$, or a combination thereof. In the composition, an amount of the metal oxide may be less than or equal to about 15 wt %, based on that of a solid in the composition. The metal oxide fine particle may have an appropriately selected diameter without being particularly limited. The diameter of the metal oxide fine particle may be greater than or equal to about 100 nm, for example, greater than or equal to about 150 nm, or greater than or equal to about 200 nm and less than or equal to about 1,000 nm or less than or equal to about 800 nm.

The thiol compound may be a dithiol compound, a trithiol compound, a tetrathiol compound, or a combination thereof.

For example, the thiol compound may be glycol di-3-mercaptopropionate, glycol dimercapto acetate, trimethylolpropane tris(3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight of the composition. The amount of the thiol compound may be greater than or equal to about 0.1 wt %, for example, greater than or equal to about 0.5 wt % or greater than or equal to about 1 wt %, based on a total weight of the composition.

The composition may further include an organic solvent (or liquid vehicle). Types of the usable organic solvent (or liquid vehicle) are not particularly limited. A type and an amount of the organic solvent (or liquid vehicle) may be appropriately determined by considering the aforementioned main components (i.e., the quantum dot, the COOH group-containing binder, the photopolymerizable monomer, the photoinitiator, and if used, the thiol compound), and a type and an amount of an additive which is described later. The composition may include a solvent in a residual amount except for a desired amount of the solid content (non-volatile components). The solvent (or liquid vehicle) may be appropriately selected considering other components (e.g., a binder, a photopolymerizable monomer, a photoinitiator, and other additives) in the composition, affinity for an alkali-developing solution, a boiling point, and the like. Examples of the solvent may include ethylene glycols, ethyl 3-ethoxy propionate, ethylene glycol, diethylene glycol, or polyethylene glycol; glycol ethers such as ethylene glycol monomethyl ether, ethylene glycol monoethyl ether, diethylene glycol monomethyl ether, ethylene glycol diethyl ether, or diethylene glycol dimethyl ether; glycol ether acetates such as ethylene monomethyl ether glycol acetate, ethylene glycol monoethyl ether acetate, diethylene glycol monoethyl ether acetate, or diethylene glycol monobutyl ether acetate; propylene glycol such as propylene glycol; propylene glycol ethers such as propylene glycol monomethyl ether, propylene glycol monoethyl ether, propylene glycol monopropyl ether, propylene monobutyl ether, propylene glycol dimethyl ether, dipropylene glycol dimethyl ether, propylene glycol diethyl ether, or dipropylene glycol diethyl ether; propylene glycol ether acetates such as propylene glycol monomethyl ether acetate, or dipropylene glycol monoethyl ether acetate; amides such as N-methylpyrrolidone, dimethyl formamide, or dimethyl acetamide; ketones such as methylethylketone (MEK), methylisobutylketone (MIBK), or cyclohexanone; petroleums such as toluene, xylene, or solvent naphtha; esters such as ethyl acetate, butyl acetate, or ethyl lactate; ethers such as diethyl ether, dipropyl ether, or dibutyl ether, aliphatic, alicyclic, or aromatic hydrocarbons or carboxylate/ester derivatives thereof (e.g., cyclohexyl acetate, etc.), and a mixture thereof.

If desired, the composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on preparation of the composition and production of the quantum dot-polymer composite and optionally a patterning of the composite. The additives may be a material having a desired function without being particularly limited.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt %, based on a total weight of the composition, but is not limited thereto. If used, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, based on a total weight of the composition, but is not limited thereto.

The composition may be prepared by appropriately mixing the aforementioned components.

In an embodiment, a quantum dot-polymer composite includes a polymer matrix; and the aforementioned quantum dots dispersed in the polymer matrix. The polymer matrix may include a thiolene resin, a linear or cross-linked substituted or unsubstituted poly(meth)acrylate, a linear or cross-linked polyurethane, a linear or cross-linked epoxy resin, a linear or cross-linked substituted or unsubstituted vinyl polymer, a linear or cross-linked silicone resin, or a combination thereof.

The polymer matrix may include a cross-linked polymer, a binder polymer having a carboxylic acid group, or a combination thereof. The cross-linked polymer may include a thiolene resin, cross-linked poly(meth)acrylate, cross-linked polyurethane, a cross-linked epoxy resin, a cross-linked vinyl polymer, a cross-linked silicone resin, or a combination thereof.

In an embodiment, the polymer matrix may include a binder polymer, a polymerization product of a photopolymerizable monomer including a carbon-carbon double bond, and optionally a polymerization product of the photopolymerizable monomer and a multiple thiol compound having at least two thiol groups at the terminal end. The quantum dot, the binder polymer, the photopolymerizable monomer, and the multiple thiol compound are the same as described above.

The quantum dot polymer composite may have a film shape. The film may have, for example, a thickness of less than or equal to about 200 μm, less than or equal to about 190 μm, less than or equal to about 180 μm, less than or equal to about 170 μm, less than or equal to about 160 μm, less than or equal to about 150 μm, less than or equal to about 140 μm, less than or equal to about 130 μm, less than or equal to about 120 μm, less than or equal to about 110 μm, less than or equal to about 100 μm, less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 10 μm, less than or equal to about 8 μm, or less than or equal to about 7 μm and greater than or equal to about 2 μm, for example, greater than or equal to about 3 μm, greater than or equal to about 3.5 μm, or greater than or equal to about 4 μm.

In an embodiment, a quantum dot polymer composite may be configured to have a reduced level of Stokes shift (for example, of less than or equal to about 30 nm, less than or equal to about 29 nm, less than or equal to about 28 nm, less than or equal to about 27 nm, less than or equal to about 25 nm, less than or equal to about 24 nm, less than or equal to about 23 nm, less than or equal to about 22 nm, less than or equal to about 21 nm, or less than or equal to about 20 nm). In an embodiment, a quantum dot polymer composite may be configured to emit light having a FWHM of less than about 38 nm, for example, less than or equal to about 37 nm, less than or equal to about 36 nm, less than or equal to about 35 nm, less than or equal to about 34 nm, or less than or equal to about 33 nm.

The quantum dot polymer composite may exhibit improved thermal stability. Accordingly, the quantum dot polymer composite may exhibit photo-conversion efficiency (PCE) of greater than or equal to about 20% when heat-treated at about 180° C. for about 30 minutes under a nitrogen atmosphere.

In an embodiment, a display device includes a light source and a photoluminescence element, and the photoluminescence element includes the aforementioned quantum dot-polymer composite and the light source is configured to provide the photoluminescence element with incident light. The incident light may have a photoluminescence peak wavelength of greater than or equal to about 440 nm, for example, greater than or equal to about 450 nm and less than or equal to about 500 nm, for example, less than or equal to about 490 nm, less than or equal to about 480 nm, less than or equal to about 470 nm, or less than or equal to about 460 nm.

In an embodiment, the photoluminescence element may include a sheet of the quantum dot polymer composite. The display device may further include a liquid crystal panel and the sheet of the quantum dot polymer composite may be disposed between the light source and the liquid crystal panel. FIG. 1A is an exploded view of a non-limiting display device.

Referring to FIG. 1A, the display device may have a structure wherein a reflector, a light guide panel (LGP) and a blue LED light source (Blue-LED), the aforementioned quantum dot-polymer composite sheet (QD sheet), for example, various optical films such as a prism, double brightness enhance film (DBEF), and the like are stacked and a liquid crystal (LC) panel is disposed thereon.

The display device may not include a liquid crystal layer. The display device may include a blue organic light emitting diode (OLED) as a light source. Referring to FIG. 1B, the display device may include a (blue) organic light emitting diode (OLED) as a light source and a sheet of the quantum dot polymer composite including a mixture of red and green quantum dots thereon. An absorption-type color filter layer (having red/green/blue (R/G/B) sections) and a substrate may be disposed on the sheet of the quantum dot polymer composite.

The organic light emitting diode (OLED) may include at least two pixel electrodes on a substrate, a pixel define layer formed between neighboring pixel electrodes, an organic emission layer on each pixel electrode, and a common electrode layer formed on the organic emission layer.

The substrate may include an insulating material and may have flexibility. Details of the substrate will be described later.

A line layer including a thin film transistor or the like is formed on the substrate. The line layer may further include a gate line, a sustain voltage line, a gate insulating layer, a data line, a source electrode, a drain electrode, a semiconductor, a protective layer, and the like. The detail structure of the line layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described later.

The pixel electrode may function as an anode of the display device. The pixel electrode may be formed of a transparent conductive material such as indium tin oxide (ITO) or indium zinc oxide (IZO). The pixel electrode may be formed of a material having a light-blocking property such as gold (Au), platinum (Pt), nickel (Ni), tungsten (W), chromium (Cr), molybdenum (Mo), iron (Fe), cobalt Co), copper (Cu), palladium (Pd), titanium (Ti), and the like. The pixel electrode may have a two-layered structure where the aforementioned transparent conductive material and the aforementioned material having light-blocking properties are stacked sequentially.

Between two adjacent pixel electrodes, a pixel define layer (PDL) overlapped with a terminal end of the pixel electrode to divide the pixel electrode into a pixel unit. The pixel define layer is an insulating layer which may electrically block the at least two pixel electrodes.

The pixel define layer covers a part of the upper surface of the pixel electrode, and the remaining region of the pixel electrode where is not covered by the pixel define layer may provide an opening. An organic emission layer which will be described later may be formed on the region defined by the opening.

The organic emission layer defines each pixel area by the aforementioned pixel electrode and pixel define layer. In other words, one pixel area may be defined as an area where is formed with one organic emission unit layer which is contacted with one pixel electrode divided by the pixel define layer.

For example, in the display device according to an embodiment, the organic emission layer may be defined as a first pixel area, a second pixel area, and a third pixel area, and each pixel area is spaced apart from each other leaving a predetermined interval by the pixel define layer.

The organic emission layer may emit a third light belonging to a visible light region or belonging to a UV region. That is, each of the first to the third pixel areas of the organic emission layer may emit a third light. In an embodiment, the third light may be a light having the highest energy in the visible light region, for example, may be blue light. When all pixel areas of the organic emission layer are designed to emit the same light, e.g., light of the same color, each pixel area of the organic emission layer may be formed of the same or similar materials or may exhibit the same or similar properties. Accordingly, a process difficulty of forming the organic emission layer may be relieved, e.g., minimized or avoided, and the display device may be applied for, e.g., formed by, a large scale/large area process. However, the organic emission layer according to an embodiment is not necessarily limited thereto, but the organic emission layer may be designed to emit at least two different lights, e.g., at least two different colored lights.

The organic emission layer may include an organic emission unit layer in each pixel area, and each organic emission unit layer may further include an auxiliary layer (e.g., a hole injection layer, a hole transport layer, an electron transport layer, etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or passivation layer may be formed on the common electrode. The planarization layer may include an (e.g., transparent) insulating material for providing electrical insulation with the common electrode.

The absorption-type color filter layer may be formed corresponding to each pixel area. The absorption-type color filter layer may include a green (G) section configured to selectively pass green light and to absorb (i.e., block) light in other wavelengths, a red (R) section configured to selectively pass red light and to absorb (i.e., block) light in other wavelengths, and a blue (B) section configured to selectively pass blue light and to absorb (i.e., block) green light and red light (e.g., light in a wavelength of less than or equal to about 500 nm).

In an embodiment, the display device may include a stack structure including a (e.g., transparent) substrate and a light emission layer disposed on the substrate as a photoluminescence element, wherein in the stack structure, the light emission layer may include a pattern of the quantum dot polymer composite and the pattern includes at least one repeating section emitting light in a predetermined wavelength.

The stack structure includes a (e.g., transparent) substrate and a light emission layer disposed on the substrate and including the pattern of the quantum dot polymer composite, the quantum dot polymer composite includes a polymer matrix; and a plurality of quantum dots dispersed in the polymer matrix, and the plurality of quantum dots include the aforementioned quantum dots. The pattern of the quantum dot polymer composite includes at least one repeating section emitting light in a predetermined wavelength. In an embodiment, the pattern of the quantum dot polymer composite includes at least one repeating section such as a first section emitting first light or a second section emitting second light.

The first light and the second light have a different maximum photoluminescence peak wavelength in a photoluminescence spectrum. In an embodiment, the first light may be red light present at a maximum photoluminescence peak wavelength of about 600 nm to about 650 nm (e.g., about 620 nm to about 650 nm), and the second light may be green light present at a maximum photoluminescence peak wavelength of about 500 nm to about 550 nm (e.g., about 510 nm to about 550 nm). The pattern of the quantum dot polymer composite may further include a third section to emit or transmit third light (e.g., blue light) that is different from the first light and the second light. A maximum peak wavelength of the third light may be greater than or equal to about 380 nm, for example, greater than or equal to about 420 nm, greater than or equal to about 430 nm, greater than or equal to about 440 nm, or greater than or equal to about 445 nm and less than or equal to about 480 nm, for example, less than or equal to about 470 nm, less than or equal to about 460 nm, or less than or equal to about 455 nm. The light source may emit the third light.

In a patterned film of the quantum dot polymer composite of a device according to an embodiment, the first section may be a section emitting red light, the second section may be a section emitting green light, and the light source may be an element emitting blue light. In this case, optical elements for blocking (e.g., reflecting or absorbing) blue light may be disposed on front surfaces (light-emitting surfaces) of the first section and the second section.

The substrate may be a substrate including an insulating material. The substrate may include glass; various polymers such as a polyester (e.g., polyethyleneterephthalate (PET), polyethylenenaphthalate (PEN), a polymethacrylate, a poly-acrylate, and the like); a polycarbonate; a polysiloxane (e.g., polydimethylsiloxane (PDMS)); inorganic materials such as $Al_2O_3$, and ZnO; or a combination thereof, but is not limited thereto. A thickness of the substrate may be appropriately selected considering a substrate material but is not particularly limited. The substrate may have flexibility. The substrate may be configured to have a transmittance of greater than or equal to about 50%, greater than or equal to about 60%, greater than or equal to about 70%, greater than or equal to about 80%, or greater than or equal to about 90% for light emitted from the quantum dot.

Figure 2:
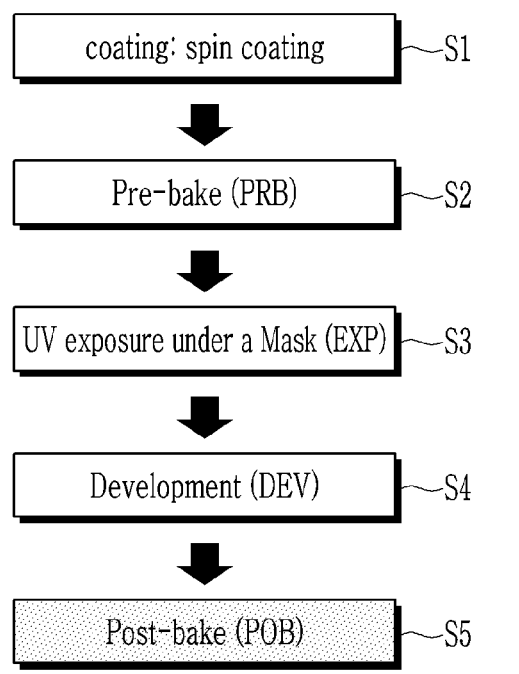
FIG. 2 shows a process of producing a quantum dot polymer composite pattern using a composition according to an embodiment.
Figure 2:
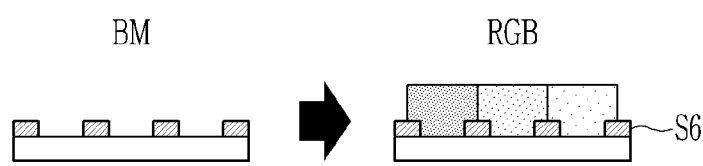

In an embodiment, a method of producing the aforementioned stack structure includes forming a film of the aforementioned composition on a substrate;

exposing a selected region of the film to light (e.g., a wavelength of less than or equal to about 400 nm); and developing the exposed film with an alkali developing solution to obtain a pattern of the quantum dot polymer composite. The substrate and the composition are the same as described above. A non-limiting method of forming the aforementioned pattern will be explained below, referring to FIG. 2.

The aforementioned composition is coated to have a predetermined thickness on a substrate in an appropriate method of spin coating, slit coating, and the like (S1). The formed film may be, optionally, pre-baked (PRB). The pre-baking may be performed by selecting appropriate conditions of temperatures, times, atmospheres, and the like (S2).

The formed (or optionally pre-baked) film is exposed (EXP) to light having a predetermined wavelength under a mask having a predetermined pattern (S3). A wavelength and intensity of the light may be selected considering types and amounts of the photoinitiator, types and amounts of the quantum dots, and the like.

The exposed film is treated with an alkali developing (DEV) solution (e.g., dipping or spraying) to dissolve an unexposed region and obtain a desired pattern (S4). The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes) (S5).

When the pattern of the quantum dot-polymer composite has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green quantum dot, or optionally, a blue quantum dot) and necessary times (e.g., twice or more or three times or more) repeating a formation of the above pattern about each of the aforementioned compositions (S6). For example, the quantum dot-polymer composite may have a pattern of at least two repeating color sections (e.g., red/green/blue (RGB) sections). The pattern of the quantum dot-polymer composite may be used as a photoluminescence-type color filter in a display device.

In an embodiment, the aforementioned stack structure may be produced using an ink composition. The method may include depositing the same (e.g., to provide a desirable pattern) on the desirable substrate or an organic light emitting diode (e.g., blue light emitting OLED) that will be described later, using an appropriate system (e.g., droplet discharging device such as inkjet or nozzle printing device) and heating the same to remove a solvent and to perform a polymerization. The method may provide a highly precise quantum dot-polymer composite film or pattern in a simple way for a short time.

In a display device according to an embodiment, the light source may include, for example, an organic light emitting diode (OLED).

Figure 3A:
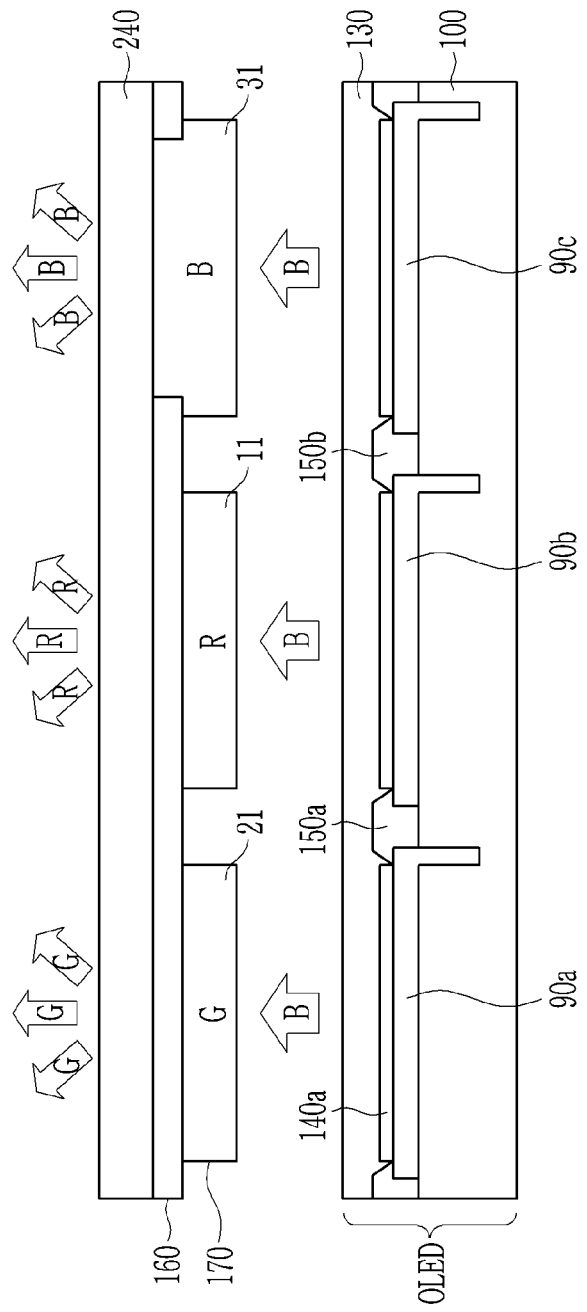
FIGS. 3A and 3B are schematic cross-sectional views of display devices according to an embodiment.
Figure 3B:
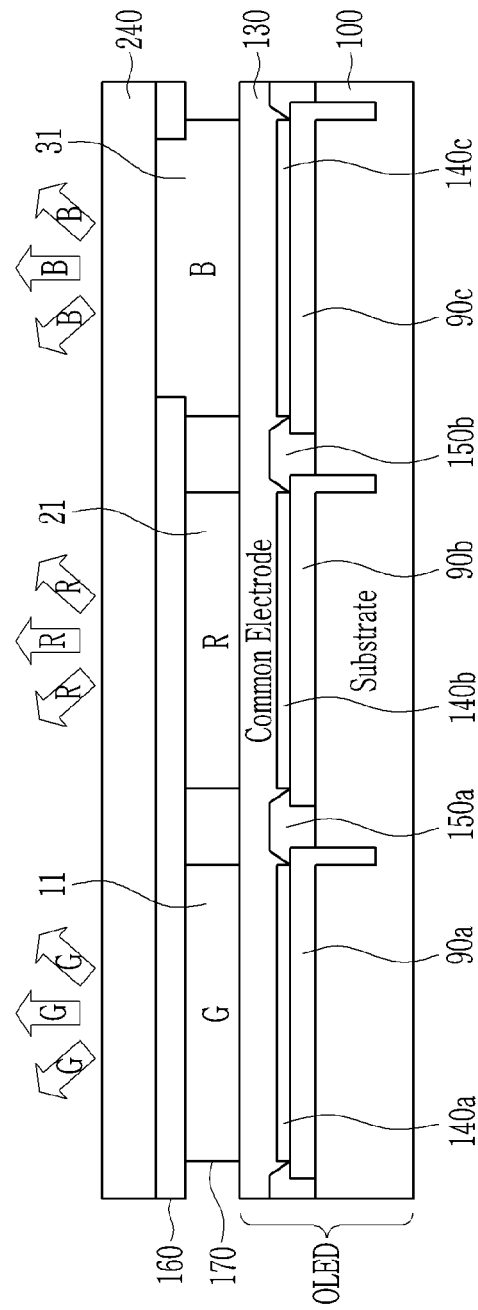

FIGS. 3A and 3B are schematic cross-sectional views of display devices according to embodiments. Referring to FIG. 3A and FIG. 3B, the light source may include an organic light emitting diode OLED. For example, the OLED may emit blue light or a light having a wavelength in a region of about 500 nm or less.

Details of the organic light emitting diode OLED are the same as set forth above. The OLED may include (at least two) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

The pixel areas of the OLED may be disposed corresponding to the first, second, and third sections that will be described in detail below, respectively.

The stack structure that includes a quantum dot-polymer composite pattern 170 (e.g., including a first repeating section including green light emitting quantum dots, a second repeating section including red light emitting quantum dots, or a combination thereof) and a substrate, or the quantum dot-polymer composite pattern 170, may be disposed on or over a light source, for example, directly on the light source.

The light (e.g., blue light) emitted from the light source may enter the second section 21 and the first section 11 of the pattern to emit (e.g., converted) red light R and green light G, respectively. Blue light B emitted from the light source passes through or transmits from the third section 31. Over the second section 21 emitting red light, the first section 11 emitting green light, or a combination thereof, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed between the upper substrate 240 and the quantum dot-polymer composite pattern 170 and over the first section 11 and the second section 21. Details of the blue cut layer are the same as set forth for the first optical filter 310 below.

The aforementioned device may be manufactured by separately manufacturing the aforementioned stack structure and (e.g., blue light-emitting) OLED and then, assembling them. The device may be manufactured by directly forming a quantum dot polymer composite pattern on the OLED.

In an embodiment, the display device may further include a lower substrate 210, an optical element (e.g., polarizer) 300 disposed below the lower substrate 210, and a liquid crystal layer 220 interposed between the stack structure and the lower substrate 210. The stack structure may be disposed in such a manner that a light emitting layer (i.e., the quantum dot-polymer composite pattern 170) faces the liquid crystal layer. The display device may further include an optical element (e.g., polarizer) 300 between the liquid crystal layer 220 and the light emitting layer. The light source may further include an LED and optionally a light guide panel.

Figure 4:
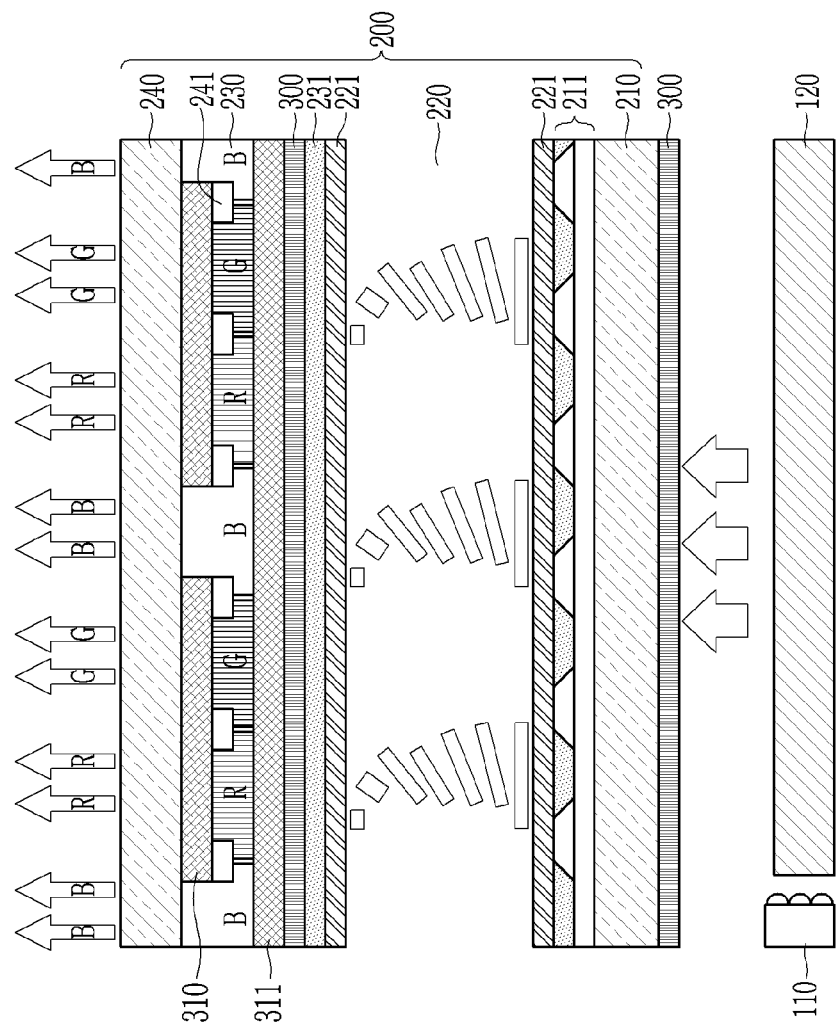
FIG. 4 is a cross-sectional view of a display device according to an embodiment.

Non-limiting examples of the display device (e.g., a liquid crystal display device) according to an embodiment are illustrated with a reference to a drawing. FIG. 4 is a schematic cross sectional view showing a liquid crystal display according to an embodiment. Referring to FIG. 4, the display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stack structure, and a liquid crystal layer 220 disposed between the stack structure and the lower substrate. The stack structure includes a transparent substrate 240 and a light emission layer 230 including a pattern of the quantum dot polymer composite.

The lower substrate 210 that is also referred to be an array substrate may be a transparent insulation material substrate. The substrate is the same as described above. A wire plate 211 is provided on an upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

A lower polarizer 300 is provided under the lower substrate. Materials and structures of the polarizer 300 are not particularly limited. A backlight unit (e.g., emitting blue light) may be disposed under the polarizer 300. An upper optical element or an upper polarizer 300 may be provided between the liquid crystal layer 220 and the transparent substrate 240, but is not limited thereto. For example, the upper polarizer may be disposed between the liquid crystal layer 220 and the light emission layer 230. The polarizer may be any suitable polarizer that used in a liquid crystal display device. The polarizer may be TAC (triacetyl cellulose) having a thickness of less than or equal to about 200 µm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector, a light guide panel provided on the reflector and providing a planar light source with the liquid crystal panel 200, at least one optical sheet on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector, and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are not particularly limited.

A black matrix (BM) 241 is provided under the transparent substrate 240 and has openings and hides a gate line, a data line, and a thin film transistor of the wire plate on the lower substrate. For example, the black matrix 241 may have a lattice shape. The light emission layer 230 is provided in the openings of the black matrix 241 and has a pattern of the quantum dot-polymer composite including a section (R) configured to emit a first light (e.g., red light), a section (G) configured to emit a second light (e.g., green light), and a third section (B) configured to emit/transmit, for example, blue light. If needed, the light emission layer may further include at least one fourth section. The fourth section may include a quantum dot that emits different color from light emitted from the first to third sections (e.g., cyan, magenta, and yellow light).

In the light emission layer 230, sections forming a pattern may be repeated corresponding to pixel areas formed on the lower substrate. A transparent common electrode 231 may be provided on the photoluminescent color filter layer.

The display device may further include a second optical filter layer 311 (e.g., a red/green or yellow light recycling layer) disposed between the light emission layer 230 and the liquid crystal layer 220 (e.g., between a light emission layer 230 and an upper polarizer 300) and transmitting at least a part of the third light and reflecting at least a part of the first light and the second light. The second optical filter layer may reflect light in a wavelength region of greater than about 500 nm. The first light may be red light, the second light may be green light, and the third light may be blue light.

The third section (B) configured to emit/transmit blue light may be a transparent color filter that does not change a light emitting spectrum of the light source. In this case, blue light emitted from the backlight unit may enter in a polarized state and may be emitted through the polarizer and the liquid crystal layer as it is. If needed, the third section may include a quantum dot emitting blue light.

If needed, the display device may further have a blue light blocking layer (blue cut filter) or a first optical filter layer. The blue light blocking layer or the first optical filter layer may be disposed between lower surfaces of the first section (R) and the second section (G) and the upper substrate 300 or on the upper surface of the upper substrate. The blue light blocking layer or the first optical filter layer may be a sheet having an opening in a region corresponding to a pixel area (a third section) displaying blue and thus formed in a region corresponding first and second sections. That is to say, the first optical filter layer may be disposed at the positions except the position overlapped with the third section and integrally therewith as shown in FIG. 4 but is not limited thereto. For example, at least two first optical filter layers may be disposed leaving a space at each position overlapped with the first and second sections.

The first optical filter layer may block light having, for example, a predetermined wavelength region in the visible light region and may transmit light in other wavelength regions, and, for example, may block blue light and may transmit light except for the blue light. For example, the first optical filter layer may transmit green light, red light, and/or yellow light which is a mixed color thereof.

The first optical filter layer may substantially block, for example, blue light having a wavelength of less than or equal to about 500 nm, and may have a property to transmit visible light having a wavelength of greater than about 500 nm and less than or equal to about 700 nm.

For example, the first optical filter layer may have a light transmittance of greater than or equal to about 70%, greater than or equal to about 80%, greater than or equal to about 90%, or even about 100% for other visible light having a wavelength of greater than or equal to 500 nm and less than or equal to about 700 nm.

The first optical filter layer may be a polymer thin film including a dye and a pigment absorbing a wavelength which is to be blocked, and may absorb greater than or equal to about 80%, greater than or equal to about 90%, greater than or equal to about 95% of blue light, but may have a light transmittance of greater than or equal to about 70%, greater than or equal to about 80%, greater than or equal to about 90%, and even about 100% of other visible light having a wavelength of greater than about 500 nm and less than or equal to about 700 nm.

The first optical filter layer may substantially block (e.g., absorb) blue light having a wavelength of less than or equal to about 500 nm by absorbing the same, and may selectively transmit, for example, green light, or red light. In this case, at least two first optical filter layers may be disposed spaced apart at each position which is overlapped with each of the first to second sections, respectively. For example, the first optical filter layer selectively transmitting red light may be disposed in a position which is overlapped with the red light emitting section, and the first optical filter layer selectively transmitting green light may be disposed on a position which is overlapped with the green light emitting section. For example, the first optical filter layer may include a first region to block (e.g., absorb) blue light and red light and to selectively transmit light in predetermined ranges (e.g., greater than or equal to about 500 nm, greater than or equal to 510 nm, greater than or equal to about 515 nm and less than or equal to about 540 nm, less than or equal to about 535 nm, less than or equal to about 530 nm, less than or equal to about 525 nm, or less than or equal to about 520 nm); a second region to block (e.g., absorb) blue light and green light and to selectively transmit light in predetermined ranges (e.g., greater than or equal to about 600 nm, greater than or equal to about 610 nm, or greater than or equal to about 615 nm and less than or equal to about 640 nm, less than or equal to about 635 nm, less than or equal to about 630 nm, less than or equal to about 625 nm, or less than or equal to about 620 nm); or a combination thereof. The first region may be disposed at a position overlapped with the green light emitting section and the second region may be disposed at a position overlapped with the red light emitting section. The first region and the second region may optically be isolated. Such a first optical filter layer may contribute to improvement of color purity of the display device.

The first optical filter layer may be a reflective filter including a plurality of layers (e.g., inorganic material layer) having different refractive indexes and for example, may be formed by alternately stacking two layers having different refractive indexes, for example, by alternately stacking a layer having a high refractive index and a layer having a low refractive index. As the refractive index difference between the layer having a high refractive index and the layer having a low refractive index is higher, the provided first optical filter layer has the higher selectivity to a wavelength. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

The total thickness of the first optical filter layer may be, for example, from about 3 nm to about 10,000 nm, about 300 nm to about 10,000 nm, or about 1,000 nm to about 10,000 nm. All layers having a high refractive index may have the same thickness and the same material or different from each other, and all layers having a low refractive index may have the same thickness and the same material or different from each other.

The display device may further include a second optical filter layer (e.g., a red/green or yellow light recycle layer) disposed between the light emission layer and the liquid crystal layer (e.g., the light emission layer and the upper polarizer), transmitting at least a portion of third light, and reflecting at least a portion of the first light and/or second light. The second optical filter layer may reflect light in a wavelength region of greater than about 500 nm. The first light may be red light, the second light may be green light and the third light may be blue light.

In the display device according to an embodiment, the second optical filter layer may be formed as an integrated layer having a relatively planar surface.

In an embodiment, the second optical filter layer may include a monolayer having a low refractive index, for example, the second optical filter layer may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking material having a high refractive index and material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof, but according to an embodiment, the layer having a high refractive index in the second optical filter layer may include a variety of materials having a higher refractive index than the layer having a low refractive index.

The layer having a low refractive index in the second optical filter layer may include, for example, a silicon oxide, but according to an embodiment, the layer having a low refractive index in the second optical filter layer may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, each thickness of the layer having a high refractive index and the layer having a low refractive index and the stacked number thereof may be determined depending upon a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and transmits at least a portion (e.g., whole part) of the third light (B). For example, the second optical filter layer may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Accordingly, the reflected green light and red light may pass through the first and the second sections to be emitted to the outside of the display device.

The second optical filter layer may reflect a wavelength region of greater than about 500 nm in greater than or equal to about 70%, greater than or equal to about 80%, or greater than or equal to about 90%, or even about 100%.

Meanwhile, the second optical filter layer may have a transmittance to a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or even about 100%.

An embodiment provides an electronic device including the aforementioned quantum dots. The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary examples of the present disclosure, and the present disclosure is not limited thereto.

EXAMPLES

Analysis Method
1. Ultraviolet-Visible (UV-Vis) Spectroscopic Analysis

An Agilent Cary 5000 spectrometer is used to perform a UV spectroscopic analysis and obtain UV-Visible absorption spectra.

2. Photoluminescence Analysis

A Hitachi F-7000 spectrometer is used to obtain photoluminescence (PL) spectra of the produced quantum dots at a wavelength of 450 nanometers (nm). At the spectroscopic analysis, a solution has a concentration so that an optical density for UV-Vis 458 nm is 0.09 to 0.11. The excitation light has a wavelength of about 458 nm.

3. Absolute Quantum Efficiency (Quantum Yield) of Quantum Dot

An Otsuka Electronics QE-2100 spectrometer is used to perform a photoluminescence spectroscopy at an irradiation wavelength of 450 nm. Maximum photoluminescence peak wavelengths, quantum efficiency, and full widths at half maximum (FWHM) are evaluated from photoluminescence spectra.

4. Inductively Coupled Plasma (ICP) Analysis

Inductively coupled plasma atomic emission spectroscopy (ICP-AES) is performed by using Shimadzu ICPS-8100.

Reference Example 1-1

Indium acetate, zinc acetate, and palmitic acid are dissolved in 1-octadecene in a 200 milliliter (mL) reaction flask, and the solution is heated at 120° C. under vacuum. Indium and palmitic acid are used in a mole ratio of 1:3. After one hour, an atmosphere in the reactor is converted into nitrogen. After heating the reactor at 280° C., a mixed solution of tris(trimethylsilyl)phosphine (TMS$_3$P) and trioctylphosphine as a phosphorous precursor is quickly injected thereinto and a reaction proceeds for 20 minutes. The reaction solution is rapidly cooled down to room temperature, acetone is added thereto, the mixture is centrifuged to obtain a precipitate, and the precipitate is dispersed in toluene again. An amount of TMS$_3$P and an amount of zinc acetate are about 0.5 moles and 0.5 moles per 1 mole of indium, respectively. An InZnP core obtained therefrom has a size of about 2 to 3 nm.

Reference Example 1-2

The InZnP core is prepared in the same manner as set forth in Reference Example 1-1 except that the phosphorous precursor is injected, then an additional indium precursor is added thereto, and in the latter portion of the reaction, the phosphorous precursor is added again.

Reference Example 2

A Sn added InZnP core is obtained according to the same method as Reference Example 1-2 except that as a tin compound, Sn acetate is further added in an amount of about 0.03 moles relative to one mole of indium during the reaction.

Comparative Example 1

(1) Selenium is dispersed in trioctylphosphine to prepare an Se/TOP stock solution, and sulfur is dispersed in trioctylphosphine to prepare an S/TOP stock solution.

Zinc acetate and oleic acid are dissolved in trioctylamine in a 200 mL reaction flask, and the solution is vacuum-treated at 120° C. for 10 minutes.

After substituting the inside the reaction flask with N$_2$, a temperature of the obtained solution is increased up to 180° C. and the core toluene dispersion of Reference Example 1-1 is injected into the solution. After 20 minutes, a predetermined amount of Se/TOP and optionally a predetermined amount of zinc acetate are injected into the reaction flask through three times while increasing the reactor temperature to 320° C. A reaction is performed to obtain a reaction solution including a particle having a ZnSe shell disposed on the core. The reaction totally takes 100 minutes.

Subsequently, an S/TOP stock solution and a predetermined amount of zinc acetate are injected into the reaction solution at the reaction temperature. A reaction is performed to obtain a reaction solution including a particle having a ZnS shell disposed on the ZnSe shell. The reaction takes 100 minutes.

In the reaction, a total amount of Se is 6 moles, a total amount of S is 27 moles, and a total amount of zinc is 26 moles, based on 1 mole of indium.

An excess amount of ethanol is added to reactants including the obtained core/multi-layered shell quantum dot, and the mixture is centrifuged. After the centrifugation, a supernatant is discarded therefrom, a precipitate therein is separated and dried and then re-dispersed in chloroform or toluene to obtain a quantum dot solution (hereinafter, a QD solution).

Figure 7:
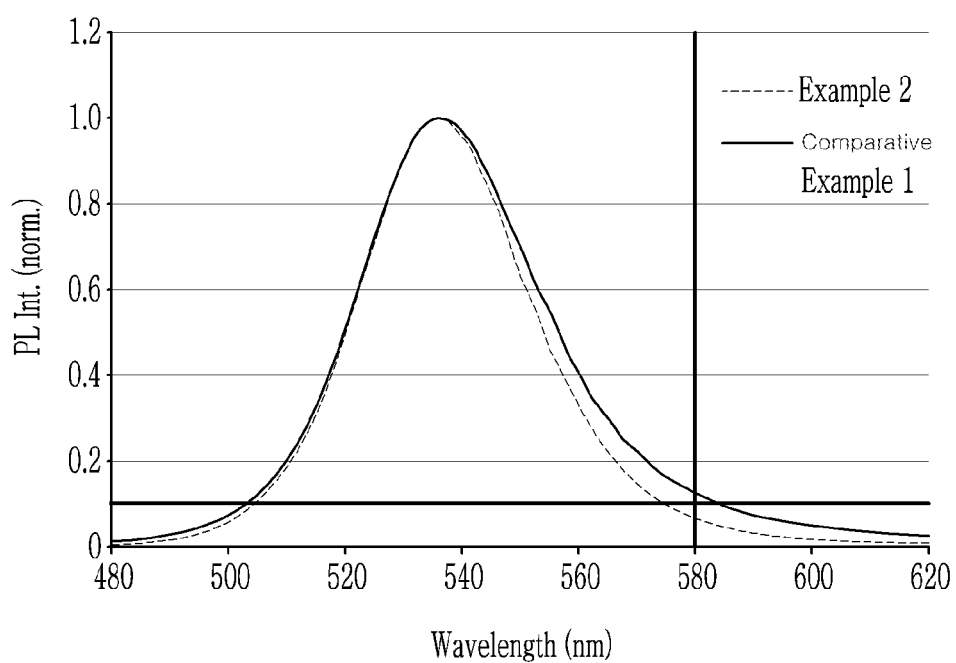
FIG. 7 is a graph of PL intensity (Int.) (normalized (norm.)) versus wavelength (nm) showing photoluminescence spectrums of the quantum dots of Example 2 and Comparative Example 1.

(2) An ICP-AES of the obtained QD is analyzed, and the result is shown in Table 1. A UV-vis spectroscopic analysis and a photoluminescence analysis of the QD are performed. The results are shown in Table 2. A photoluminescent spectrum of the quantum dot is shown in FIG. 7.

Example 1

A core/multi-layered shell quantum dot is obtained according to the same method as Comparative Example 1 except for using the core prepared in Reference Example 1-2 and lowering a core injection temperature down to 100° C., and injecting a shell precursor and ammonium fluoride.

Figure 5:
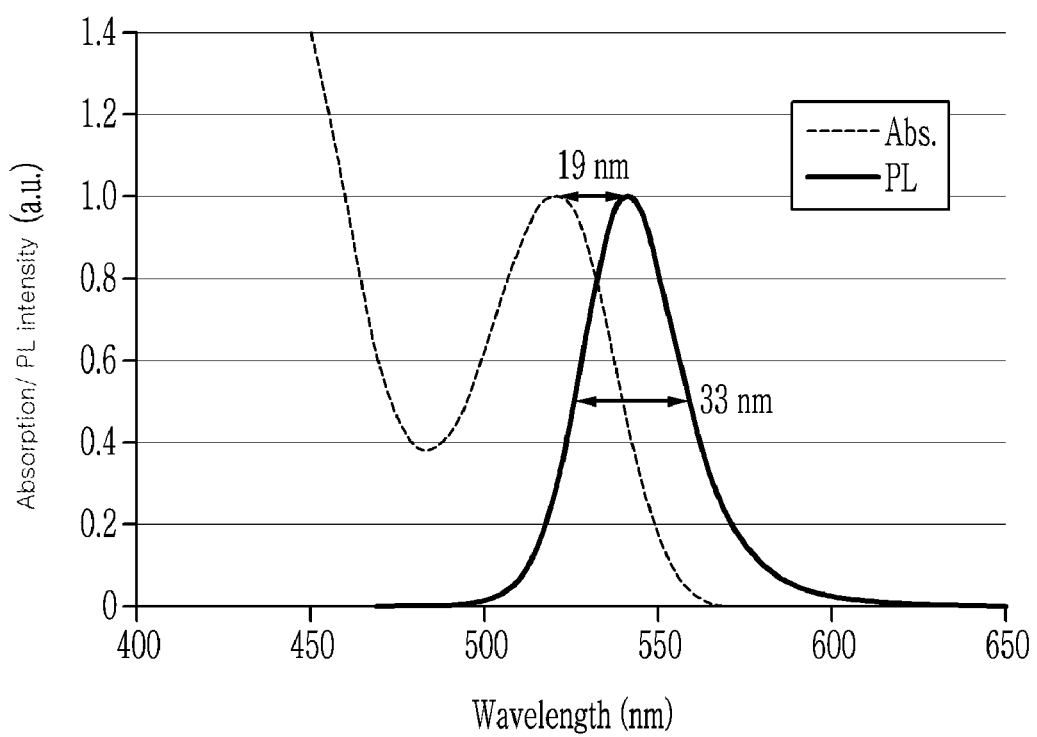
FIG. 5 is a graph of absorption/photoluminescent (PL) intensity (arbitrary units (a.u.)) versus wavelength (nm) showing a photoluminescence spectrum and an ultraviolet-visible (UV-Vis) spectrum of the quantum dot synthesized in Example 1.

An ICP-AES analysis of the QD performed, and the result is shown in Table 1. A UV-vis spectroscopic analysis and a photoluminescence analysis of the QD are performed. The results are shown in Table 2 and FIG. 5.

Example 2

A core/multi-layered shell quantum dot is obtained according to the same method as Example 1 except for using Se in an amount of 8 moles, S in an amount of 33 moles, and zinc in an amount of 33 moles relative 1 mole of indium.

Figure 6:
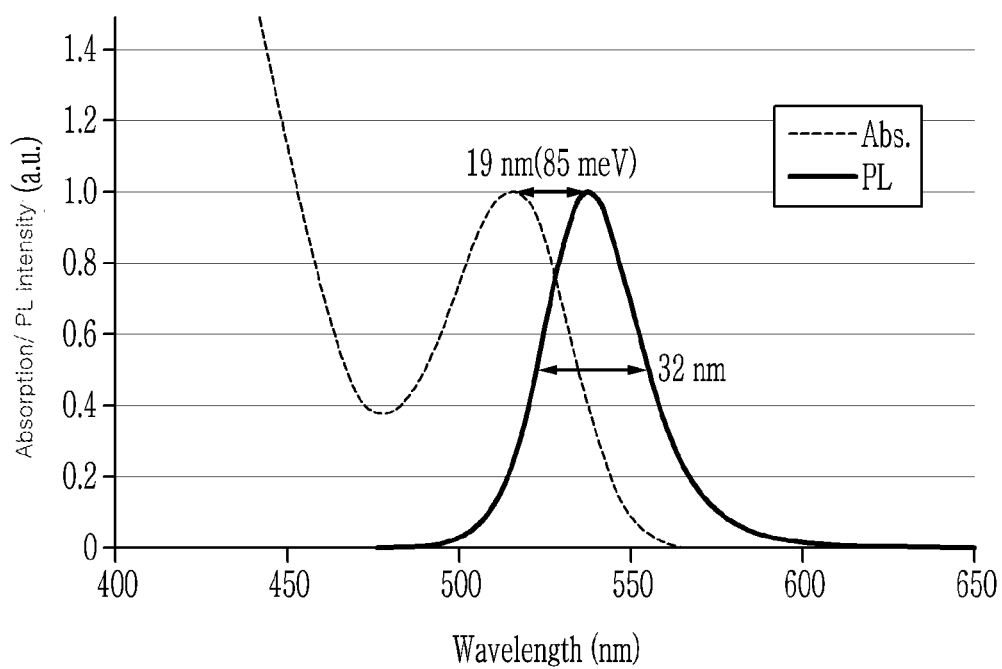
FIG. 6 is a graph of absorption/PL intensity (a.u.) versus wavelength (nm) showing a photoluminescence spectrum and a UV-Vis spectrum of the quantum dot synthesized in Example 2.

An ICP-AES analysis of the QD performed, and the result is shown in Table 1. A UV-vis spectroscopic analysis and a photoluminescence analysis of the QD are performed. The results are shown in Table 2 and FIG. 6 and FIG. 7.

Example 3

A core/multi-layered shell quantum dot is obtained according to the same method as Example 1, except that the core prepared in Reference Example 2 is used.

An ICP-AES analysis of the QD performed, and the result is shown in Table 1. A UV-vis spectroscopic analysis and a photoluminescence analysis of the QD are performed. The results are shown in Table 2.

TABLE 1

|  | Mole ratio | | | |
| --- | --- | --- | --- | --- |
|  | P:In | Zn:In | Se:S | (Se + S):In |
| Comparative Example 1 | 0.88:1 | 31.61:1 | 0.80:1 | 27.73:1 |
| Example 1 | 0.70:1 | 33.63:1 | 0.89:1 | 28.41:1 |
| Example 2 | 0.76:1 | 30.8:1 | 1.30:1 | 26.3:1 |
| Example 3 (Sn-containing core) | 0.72:1 | 29.8:1 | 0.92:1 | 24.1:1 |

TABLE 2

|  | UV first absorption peak | PL peak wavelength | Stokes shift (nm) | FWHM | Quantum Yield (QY) (%) | Size (nm) |
| --- | --- | --- | --- | --- | --- | --- |
| Comparative Example 1 | 510 | 538 | 28 | 37 | 79 | 7 |
| Example 1 | 522 | 541 | 19 | 33 | 91 | 7 |
| Example 2 | 517 | 536 | 19 | 32 | 80 | 7 |
| Example 3 (Sn-containing core) | 510 | 533 | 23 | 34 | 91 | 7 |

Referring to the result of the above tables, the quantum dots according to the Examples have a decreased Stokes shift and exhibit a narrow full width at half maximum (FWHM) compared with the quantum dot according to the Comparative Example.

The results of FIG. 7 show that the quantum dot of the Example may have a shorter tail region in comparison with the quantum dot of the Comparative Example.

Experimental Example: Color Reproducibility Measurement Under BT2020 Reference

Optical spectra of light emitted from light conversion layers including the prepared QDs are obtained and then, color gamuts are calculated under a BT2020 standard via simulation.

Quantum dot—polymer composites are prepared by the following process. The quantum dots are separated from a quantum dot dispersion via the non-solvent precipitation and centrifugation. The separated quantum dots are mixed with a monomer combination for an acrylic polymer to obtain a mixture, which is then applied on a substrate and a barrier film is covered thereon and a resulting structure is cured.

Figure 8:
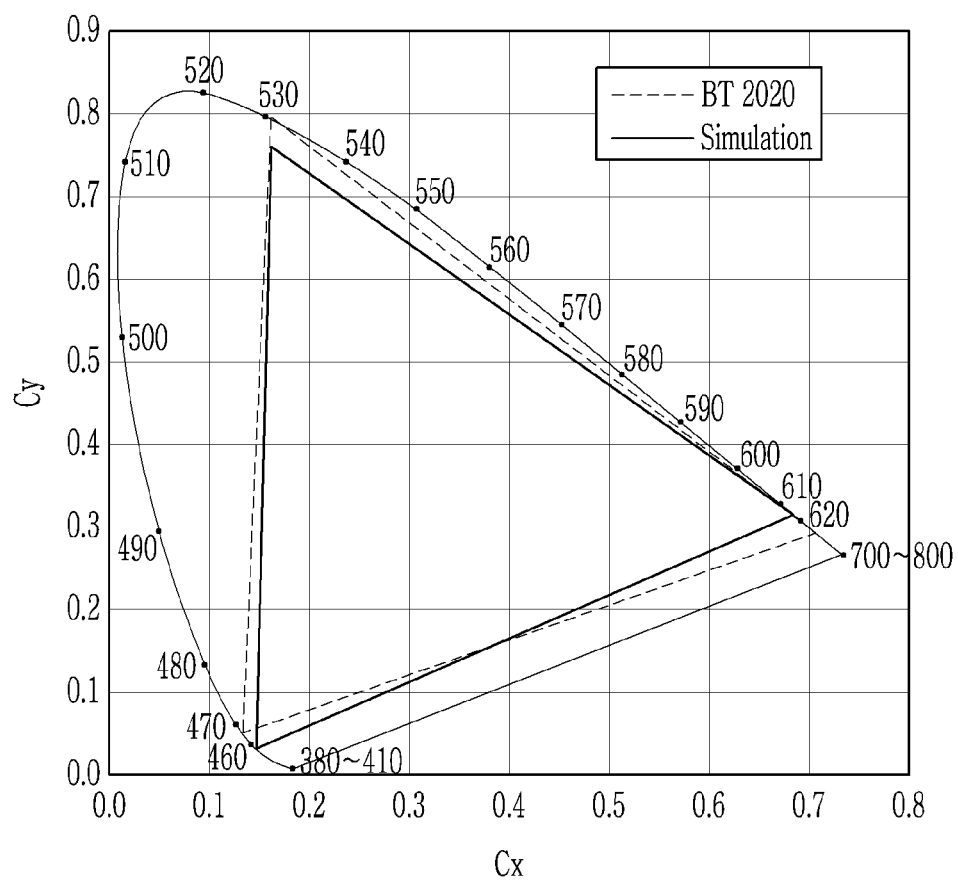
FIG. 8 is a view showing color reproducibility simulation results for a quantum dot polymer composite of the Example under the BT2020 standard.

The results are shown in Table 3 and FIG. 8 (Example 1).

TABLE 3

|  | BT2020 color reproducibility (%) |
| --- | --- |
| Comparative Example 1 | 89 |
| Example 1 | 91 |
| Example 2 | 91 |
| Example 3 | 90 |

From the results, a quantum dot polymer composite including the quantum dots of the Examples may realize relatively high color reproducibility even without a color filter.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot, comprising
a semiconductor nanocrystal core and a semiconductor nanocrystal shell disposed on the semiconductor nanocrystal core,
wherein the quantum dot does not comprise cadmium,
the core comprises a Group III-V compound comprising a Group III metal and a Group V element,
the quantum dot has a maximum photoluminescence peak in a green light wavelength region,
a full width at half maximum of the maximum photoluminescence peak is less than about 50 nanometers, a difference between a wavelength of the maximum photoluminescence peak and a first absorption peak wavelength of the quantum dot is less than or equal to about 25 nanometers, wherein in the quantum dot, a mole ratio of selenium to sulfur (Se:S) is greater than or equal to about 0.80:1 and less than or equal to 1.30:1, wherein in the quantum dot a mole ratio of phosphorus to indium is greater than or equal to about 0.6:1 and less than or equal to about 0.9:1.

2. The quantum dot of claim 1, wherein the green light wavelength region is greater than or equal to about 500 nanometers and less than or equal to about 560 nanometers, and wherein the full width at half maximum of the maximum photoluminescence peak is less than or equal to about 35 nanometers.

3. The quantum dot of claim 1, wherein in the quantum dot, a mole ratio of selenium to sulfur (Se:S) is greater than or equal to about 0.85:1 and less than or equal to 1.30:1.

4. The quantum dot of claim 1, wherein the Group V element does not comprise arsenic, antimony, or a combination thereof.

5. The quantum dot of claim 1, wherein in the quantum dot a mole ratio of phosphorus to indium is greater than or equal to about 0.65:1 and less than or equal to about 0.8:1 and the Group V element does not comprise arsenic, antimony, or a combination thereof.

6. The quantum dot of claim 1, wherein in the quantum dot,
a mole ratio of sulfur and selenium relative to indium ((S+Se)/In) is greater than or equal to about 20:1 and less than or equal to about 36:1; and
a mole ratio of zinc relative to indium is greater than or equal to about 25:1 and less than or equal to about 40:1.

7. The quantum dot of claim 1, wherein the quantum dot has a size of greater than or equal to about 5 nanometers and less than or equal to about 8 nanometers.

8. The quantum dot of claim 1, wherein the quantum dot has quantum efficiency of greater than or equal to about 80%.

9. The quantum dot of claim 1, wherein the green light wavelength region is greater than or equal to about 510 nanometers and less than or equal to 536 nanometers.

10. A quantum dot polymer composite comprising a polymer matrix and the quantum dot of claim 1, wherein the quantum dot polymer composite is configured to emit light and a full width at half maximum of a luminescent peak of the light is less than or equal to about 38 nm.

11. The quantum dot polymer composite of claim 10, wherein the quantum dot polymer composite is configured to emit light having Cy of greater than or equal to about 0.23 and less than or equal to about 0.24 and Cx of greater than or equal to about 0.18 and less than or equal to about 0.19 in a color coordination.

12. A display device comprising a light source and a photoluminescence element, wherein the photoluminescence element comprises the quantum dot of claim 1, and the light source is configured to provide the photoluminescence element with incident light.

13. The display device of claim 12, wherein the photoluminescence element is a stack structure comprising a substrate and a light emission layer disposed on the substrate, wherein the light emission layer comprise a pattern of a quantum dot polymer composite and the quantum dot polymer composite comprises a polymer matrix and the quantum dot dispersed in the polymer matrix.

14. The display device of claim 12, wherein the display device is configured to have color reproducibility of greater than or equal to about 80% under a standard of BT2020.

15. A quantum dot, comprising
a semiconductor nanocrystal core and a semiconductor nanocrystal shell disposed on the semiconductor nanocrystal core,
wherein the quantum dot does not comprise cadmium,
the core comprises a Group III-V compound comprising a Group III metal and a Group V element,
the quantum dot has a maximum photoluminescence peak in a green light wavelength region,
a full width at half maximum of the maximum photoluminescence peak is less than about 50 nanometers,
a difference between a wavelength of the maximum photoluminescence peak and a first absorption peak wavelength of the quantum dot is less than or equal to about 25 nanometers, and wherein in the quantum dot a mole ratio of phosphorus to indium is greater than or equal to about 0.6:1 and less than or equal to about 0.9:1 and wherein the Group V element does not comprise arsenic, antimony, or a combination thereof,
the shell comprises a first semiconductor nanocrystal shell and a second semiconductor nanocrystal shell disposed on the first semiconductor nanocrystal shell, and
the second semiconductor nanocrystal shell has a thickness of less than 0.7 nanometers.

16. The quantum dot of claim 15, wherein
the first semiconductor nanocrystal shell comprises zinc and selenium and
the second semiconductor nanocrystal comprise zinc and sulfur.

17. The quantum dot of claim 1, wherein:
the shell comprises a first semiconductor nanocrystal shell and a second semiconductor nanocrystal shell disposed on the first semiconductor nanocrystal shell; and
the second semiconductor nanocrystal shell has a thickness of less than 0.7 nanometers.

18. The quantum dot of claim 15, wherein in the quantum dot, a mole ratio of selenium to sulfur (Se:S) is greater than or equal to about 0.80:1 and less than or equal to about 2:1.

19. A quantum dot, comprising
a semiconductor nanocrystal core and a semiconductor nanocrystal shell disposed on the semiconductor nanocrystal core,
wherein the quantum dot does not comprise cadmium,
the core comprises a Group III-V compound comprising a Group III metal and a Group V element,
the quantum dot has a maximum photoluminescence peak in a green light wavelength region,
a full width at half maximum of the maximum photoluminescence peak is less than about 50 nanometers,
a difference between a wavelength of the maximum photoluminescence peak and a first absorption peak wavelength of the quantum dot is less than or equal to about 25 nanometers, and
the quantum dot further comprises an additive comprising Sn, Bi, or a combination thereof.

20. A display device comprising a light source and a photoluminescence element, wherein the photoluminescence element comprises the quantum dot of claim 15, and the light source is configured to provide the photoluminescence element with incident light.

21. The quantum dot of claim 19, wherein a molar amount of the additive is less than about 0.1 moles with respect to 1 mole of the Group III metal.

22. The quantum dot of claim 1, wherein in the quantum dot, a mole ratio of selenium to sulfur (Se:S) is greater than or equal to about 0.80:1 and less than 1.30:1.

23. The quantum dot of claim 1, wherein in the quantum dot, a mole ratio of selenium to sulfur (Se:S) is greater than or equal to about 0.80:1 and less than or equal to 0.92:1.

* * * * *